United States Patent
Nagata et al.

(10) Patent No.: US 6,890,879 B2
(45) Date of Patent: May 10, 2005

(54) RECORDING MATERIAL AND IMAGE FORMING APPARATUS

(75) Inventors: Kozo Nagata, Shizuoka-ken (JP); Shintaro Washizu, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 287 days.

(21) Appl. No.: 10/135,833

(22) Filed: May 1, 2002

(65) Prior Publication Data

US 2002/0183202 A1 Dec. 5, 2002

(30) Foreign Application Priority Data

May 1, 2001 (JP) ........................................ 2001-133938

(51) Int. Cl.$^7$ ................................................ B41M 5/40
(52) U.S. Cl. ...................... 503/207; 503/200; 503/215; 503/226
(58) Field of Search ........................ 427/152; 503/200, 503/207, 208, 209, 215, 216, 226

(56) References Cited

U.S. PATENT DOCUMENTS

| | | | |
|---|---|---|---|
| 5,028,580 A | | 7/1991 | Shimomura et al. |
| 5,202,304 A | * | 4/1993 | Iwakura ...................... 503/209 |
| 5,376,456 A | | 12/1994 | Cumming et al. |
| 6,028,029 A | | 2/2000 | Takeuchi |

FOREIGN PATENT DOCUMENTS

| | | |
|---|---|---|
| EP | 0 273 752 A2 | 7/1988 |
| EP | 0 930 529 A1 | 7/1999 |

* cited by examiner

*Primary Examiner*—Bruce H. Hess
(74) *Attorney, Agent, or Firm*—Sughrue Mion, PLLC

(57) ABSTRACT

The present invention provides a recording material comprising a support, a recording layer provided on the support, and at least one protective layer provided on the recording layer, wherein, the recording layer contains a coloring component A encapsulated in heat-responsive microcapsules, and a substantially colorless compound B, which is outside the heat-responsive microcapsules and has a coloring site that colors when reacted with the coloring component A, and wherein, at least one of the protective layer or a layer adjacent thereto comprises a layer containing titanium oxide.

12 Claims, No Drawings

RECORDING MATERIAL AND IMAGE FORMING APPARATUS

BACKGROUND OF THE INVENTION

1. Field of the Invention

The present invention relates to a recording material that can record with high sensitivity to light in the ultraviolet, visible and infrared regions and can be applied to a wide range of fields, such as inks, color filters, holograms, proofs, sealants, adhesives, surface printing, resin relief printing and photoresists, and to an image forming method that the recording material.

2. Description of the Related Art

Dry type image recording methods that do not use a liquid developer and do not cause waste have been variously studied. Among these recording methods, a method using a composition that is cured with light is attracting attention. This method is characterized in that a photocurable composition, which is contained in the recording material, is cured by exposure to form a latent image, and a component, which has a coloring or decoloring reaction when heated, is moved to form a color image. Specifically, light exposes a recording material through an image copy, and a latent image is formed by curing the exposed part. Thereafter, a visual image can be formed by heating the recording material, and moving, in the uncured (unexposed) part, the coloring or decoloring component, which is inside the recording material.

According to the method, a completely dry system that causes no waste can be realized. The method is characteristic in recording a monochrome image and is particularly useful for recording a color image.

The inventors have proposed in JP-A No. 3-87827 and No. 4-211252 recording materials that suppress coloration in a non-image part and provide a high image density. In the former recording material, one of two components of a two-component type photosensitive and heat-sensitive coloration recording material is encapsulated in microcapsules, and the other is used as a curable compound of a photo-curable composition, or the other is contained outside the microcapsules with the photo-curable composition. The later recording material has a coated layer containing a photo-curable composition, which contains microcapsules encapsulating an electron-donor colorless colorant, and outside the microcapsules, an electron-acceptor compound, a polymerizable vinyl monomer and a photopolymerization initiator.

There is a demand for these recording materials to provide high glossiness to impart sophisticated feeling to an image. Furthermore, improvements in light fastness of the image are also desired in order to impart a value to the image such that the image can be appreciated for a long period of time.

The present invention is to solve the problems in the conventional art and to attain the following objects.

One of the objects of the invention is to provide a recording material providing high glossiness and high light fastness and a process for forming an image using the recording material.

SUMMARY OF THE INVENTION

The objects of the present invention can be attained by the following means. That is, the invention relates to, as one aspect, a recording material comprising:

a support;
a recording layer provided on the support; and
at least one protective layer provided on the recording layer,
wherein, the recording layer contains a coloring component A encapsulated in heat-responsive microcapsules, and a substantially colorless compound B, which is outside the heat-responsive microcapsules and has a coloring site that colors when reacted with the coloring component A, and
wherein, at least one of the protective layer or a layer adjacent thereto comprises a layer containing titanium oxide.

In one embodiment of the present invention, the protective layer includes at least two layers, and an outermost layer of the protective layer or a layer adjacent to the outermost layer is the layer containing titanium oxide.

In another embodiment of the present invention, the recording layer further contains a photopolymerizable composition.

In a further embodiment of the present invention, the compound B includes the coloring site and a polymerizable group in one molecule.

In a further embodiment of the present invention, the recording layer further contains a substantially colorless compound C, which has a site that suppresses a reaction between the coloring component A and the compound B and a polymerizable group in one molecule.

In a further embodiment of the present invention, titanium oxide contained in the layer containing titanium oxide has a particle diameter of no more than 0.2 $\mu$m.

In a further embodiment of the present invention, an amount of titanium oxide contained in the layer containing titanium oxide is from 5 to 90% by weight relative to the layer containing titanium oxide.

In a further embodiment of the present invention, the layer containing titanium oxide comprises a binder formed in a layer having titanium oxide dispersed on a surface thereof, which binder comprises polyvinyl alcohol.

The present invention also relates to, as another aspect, a process for forming an image using a recording material comprising:

a support;
a recording layer provided on the support and containing a photopolymerizable composition; and
at least one protective layer provided on the recording layer,
wherein, the process comprising the steps of:
exposing the recording material, causing the photopolymerizable composition to form a latent image;
coloring after the exposing step, causing the coloring component to form an image, which corresponds to the latent image, by heating with a heat roller; and
fixing the formed image and decoloring the photopolymerization initiator component contained in the photopolymerizable composition by irradiating the recording layer with light, wherein the recording layer containing:
 a coloring component A encapsulated in heat-responsive microcapsules; and
 a substantially colorless compound B being present outside the heat-responsive microcapsules and having a coloring part coloring upon reacting with the coloring component A, and
wherein, at least one of the protective layer or a layer adjacent thereto comprises a layer containing titanium oxide.

DETAILED DESCRIPTION OF THE PREFERRED EMBODIMENTS

In the recording material of the present invention, at least one recording layer is formed on a support, encapsulated the recording layer containing a coloring component A encapsulated in heat-responsive microcapsules, and a substantially colorless coloring component B, which is outside the heat-responsive microcapsules and has a coloring site which produces a color when reacted with the coloring component A. The recording material has a protective layer, which contains at least one layer, as the outermost layer of the recording material on the side of the recording layer, and the protective layer or a layer adjacent to the protective layer has a layer containing titanium oxide ($TiO_2$). Namely, when the protective layer of the recording material of the present invention is formed from one layer, this protective layer is formed as the layer containing titanium oxide. Alternatively, when the protective layer is formed from more than one layer, the layer containing titanium oxide is formed on the outermost layer of the recording layer and the protective layer, which is different from the layer containing titanium oxide, is formed on the layer containing titanium oxide. In both of these cases, glossiness and light fastness can be imparted to the recording material by the layer containing titanium oxide.

Further, in the image forming method of the present invention, image formation can be preferably performed onto the recording material by an image forming method, which uses the aforementioned recording material, and comprises an exposure step, a coloring step, and a fixing step.

The recording material and the process for forming an image of the present invention will be described in detail below.

Recording Material

The recording material of the present invention may be monochromatic or polychromatic. In the case of the monochromatic recording material, one recording layer having photosensitivity is provided, and a protective layer is provided as the outermost layer of the recording material on the recording layer side. In the case of polychromatic recording material, at least one recording layer having photosensitivity to a certain wavelength or lower is provided, and at least one recording layer having sensitivity to a region exceeding the certain wavelength is also provided, with a protective layer being provided as the outermost layer. The protective layer may have either a single layer structure or a laminated layer structure having two or more layers. The recording material may have an intermediate layer, and multiple intermediate layers may be provided.

The basic embodied structure of the recording material of the present invention is not particularly limited and may be appropriately selected depending on purposes there of.

As one embodiment of the basic constitutional structure, an example of image formation will be described below of a case in which the recording material of the invention is applied to a positive recording material.

In the positive recording material of this embodiment, radicals are generated, upon imagewise irradiation with light, from a radical generator contained in the photopolymerizable composition on the irradiated part, and a polymerization reaction of the polymerizable compound is initiated, hardening the polymerizable compound so as to fix the photopolymerizable compound thereon, whereby a latent image is formed. The microcapsules have unpermeability to substances at or below ordinary temperature, and thus the coloring component A encapsulated in the microcapsules and the compound B having a site, which colors when reacted with the coloring component A, are not in contact with each other, and the microcapsules are in a non-colored state.

Thereafter, when heat is applied to the entire surface of the recording material, the microcapsules are transformed to have permeability to substances. B On the non-irradiated portion, the compound penetrates into the microcapsules (and/or the coloring component A is released to the outside of the microcapsules), whereby the coloring component A and the compound B react with each other to form a color only on the non-irradiated part. On the other hand, because the photopolymerizable composition is cured and in a fixed state by the polymerization reaction in the irradiated portion, both the coloring component A and the compound B are immobilized and are not in contact with each other, preventing coloration on the irradiated part. Thereafter, by exposing the entire surface of the recording material, the polymerizable composition on the unpolymerized part are polymerized (fixation), and the dye contained in the photopolymerizable composition can be decolored.

The recording material of the present invention may be recording material of the following embodiments (first and second embodiments), and the image forming method therefor may also be appropriately selected in accordance with the embodiments.

In the recording material of the first embodiment of the invention, the polymerizable compound contained in the photopolymerizable composition is the compound B itself. That is, the compound B has both the site coloring when reacted with the coloring component A and the polymerizable group in one molecule. The recording material comprises the coloring component A, the compound B and the photopolymerizable composition. In the case where the embodiment is applied to an example of the positive recording material of the aforementioned basic embodiment, the compound B has, as described above, both the site that colors when reacted with the coloring component A and the polymerizable group. The compound B initiates a polymerization reaction and cures when irradiated with light in a shape of the image, whereby the compound B is fixed thereon to form a latent image. Therefore, the compound B is immobilized in the irradiated portion and does not contact the coloring component A, and coloration does not occur in the irradiated portion.

In the second embodiment of the recording material of the present invention, the recording layer contains the substantially colorless compound B, which has a site that colors when reacted with the coloring component A, the substantially colorless compound C, which has a site that suppresses the reaction between the coloring component A and the compound B and a polymerizable group in the same molecule, and a photopolymerizable composition.

An example of image formation will be described where the recording material of the present embodiment, having the coloring component A encompassed in the heat-responsive microcapsules, is applied to a negative recording material.

Similar to the first embodiment, the microcapsules in the negative recording material of the present embodiment have unpermeability to substances at an ordinary temperature, and thus the coloring component A and the compound B do not contact each other, and are in a non-colored state. When the recording material is irradiated with light in a form of an image, the polymerization reaction of the polymerizable compound on the irradiated portion is initiated and cured, and the polymerizable compound is fixed thereon to form a latent image. Thereafter, when heat is applied to the entire surface of the recording material, the microcapsules are transformed to be permeable to substances, and the compound B on the non-irradiated part penetrates into the microcapsules (and/or the coloring component A is released to the outside of the microcapsules). Simultaneously, on the non-irradiated portion, the compound C penetrates into the microcapsules, as a coloration suppressing compound, to suppress the coloring reaction of the coloring component A and the compound B. Therefore, the non-irradiated part is maintained in the non-colored state. On the other hand, because the compound C (coloration suppressing compound) on the irradiated part is fixed thereon through a polymerization reaction, it does not intervene in the reaction of the coloring component A and the compound B, and the coloring reaction proceeds, and thus coloration is effected only on the irradiated portion. Thereafter, the entire surface of the recording material is exposed to decolor the dye contained in the photopolymerization composition.

As a light source used in the image formation by the recording material of the present invention, light sources of blue to red and infrared lasers can be preferably selected.

The respective layers constituting the recording material of the invention will be described below.

Recording Layer

The recording material of the invention has a support having a recording layer disposed thereon, and at least one layer of the recording layer contains a coloring component A encapsulated in heat-responsive microcapsules, at least one substantially colorless compound B (hereinafter sometimes referred to as a "coloring component B"), which is present outside the heat-responsive microcapsules and has a coloring site, which colors when reacted with the coloring component A, and a photopolymerizable composition.

The recording layer can be formed by coating a coating composition, which is prepared by containing respective components. An image can be formed on the coated recording layer by, as described above, an image forming method having a step of irradiating the recording layer with light, which corresponds to sensitive wavelengths of the respective layers to form a latent image (exposing step), a step of coloring a color image by coloring the coloring components, which correspond to the latent image, by heating (coloring step), and a step of fixing the formed image and decoloring the dye through irradiation of the surface of the recording layer with light (fixing step).

Photopolymerizable Composition

The photopolymerizable composition constituting the recording layer has at least a polymerizable compound, a photopolymerization initiator and an organic boron compound.

Polymerizable Compound

The polymerizable compound has at least one ethylenic unsaturated double bond in the molecule thereof, is not particularly limited and can be appropriately selected depending on purposes. Examples thereof include acrylic acid derivatives, such as acrylates and acrylamides, acrylic acids and salts thereof, methacrylic acid derivatives, such as methacrylates and methacrylamides, methacrylic acids and salts thereof, maleic anhydrides, maleates, itaconic acids, itaconates, styrene compounds, vinyl ethers, vinyl esters, N-vinyl heterocyclic compounds, allyl ethers and allyl esters.

The polymerizable compound may have one or more olefinic double bonds and may have either a low molecular weight (monomer) or a relatively high molecular weight (oligomer).

Examples of the monomer containing a double bond include alkyl or hydroxyalkyl acrylates or methacrylates, such as methyl acrylates, ethyl acrylates, butyl acrylates, 2-ethylhexyl acrylates, 2-hydroxyethyl acrylates, isobornyl acrylates, methyl methacrylates and ethyl methacrylates. A silicon acrylate is also advantageously used.

Other examples thereof include acrylonitriles, acrylamides, methacrylamides, N-substituted (meth) acrylamides, vinyl esters, such as vinyl acetates, vinyl ethers, such as isobutyl vinyl ethers, styrenes, alkyl- and halostyrene, N-vinylpyrrolidone, vinyl chlorides and vinylidene chlorides.

Examples of the monomer containing two or more double bonds include diacrylates, such as ethylene glycols, propylene glycols, neopentyl glycols, hexamethylene glycols and bisphenol A, 4,4'-bis(2-acryloyloxyethoxy) diphenylpropanes, trimethylolpropane triacrylates, pentaerythritol triacrylates or tetraacrylates, vinyl acrylates, divinylbenzenes, divinyl succinates, diallyl phthalates, triallyl phosphate, triallyl isocyanurate and tris(2-acryloylethyl)isocyanurate.

Examples of the polyunsaturated compound having a relatively high molecular weight (oligomer) include epoxy resins having a (meth)acrylic group, polyesters having a (meth)acrylic group, and polyesters, polyurethanes or polyethers having a vinyl ether or an epoxy group. Furthermore, examples of the unsaturated oligomer include an unsaturated polyester resin that is generally produced from maleic acid, phthalic acid and at least one diol and has a molecular weight of about from 500 to 3,000. Additionally, vinyl ether monomers and oligomers, and oligomers terminated by maleates having a polyester, polyurethane, polyether, polyvinyl ether or epoxy main chain. Particularly preferred examples thereof include a combination of an oligomer having a vinyl ether group and a polymer disclosed in International Patent Application WO90/01512. Copolymers of vinyl ether and monomers having maleic acid functionality are also preferred. These kinds of unsaturated oligomers can also be categorized as prepolymers.

Particularly preferred examples include esters of an ethylenic unsaturated carboxylic acid and polyols or polyepoxides, polymers having an ethylenic unsaturated bond on a main chain or a side chain thereof, such as unsaturated polyesters, polyamides or polyurethanes and copolymers thereof, alkyd resins, polybutadienes, butadiene copolymers, polyisoprenes, isoprene copolymers, polymers or copolymers having a (meth)acrylate group on a side chain thereof, and mixtures containing one or more of these polymers.

Examples of the unsaturated carboxylic acid include acrylic acids, methacrylic acids, crotonic acids, itaconic acids, cinnamic acids, and unsaturated fatty acids, such as linoleic acids and oleic acids. Among these, acrylic acids and methacrylic acids are preferred.

Suitable examples of the polyol include an aromatic, and particularly aliphatic and alicyclic polyols. Examples of the aromatic polyol include hydroquinone, 4,4'-dihydroxydiphenyl, 2,2-di(4-hydroxyphenyl)propane, novolak and resorcin. Examples of the polyepoxide include those based on the aforementioned polyols, particularly the aromatic polyol, and epichlorohydrin. Other suitable examples of the polyol include polymers or copolymers containing a hydroxyl group on a polymer chain or a side chain thereof, such as polyvinyl alcohols and copolymers thereof, and polyhydroxyalkyl methacrylates and copolymers thereof. Further suitable examples of the polyol include oligoesters having a hydroxyl end group.

Examples of the aliphatic and alicyclic polyols include an alkylenediols preferably having from 2 to 12 carbon atoms, such as ethylene glycols, 1,2- or 1,3-propanediols, 1,2-, 1,3- or 1,4-butanediols, pentanediols, hexanediols, octanediols, dodecanediols, diethylene glycols and triethylene glycols, polyethylene glycols having a molecular weight of from 200 to 1,500, 1,3-cyclopentanediols, 1,2-, 1,3- or 1,4-cyclohexanediols, 1,4-dihydroxymethylcyclohexanes, glycerols, tris(β-hydroxyethyl)amines, trimethylolethanes, trimethylolpropanes, pentaerythritols, dipentaerythritols and sorbitols.

The polyol may be partially or completely esterified with one kind of a carboxylic acid or different kinds of unsaturated carboxylic acids, and in the partial ester, the free hydroxyl group may be modified, for example, by being etherified or esterified with another carboxylic acid.

Examples of the ester include trimethylolpropane triacrylates, trimethylolethane triacrylates, trimethylolpropane trimethacrylates, trimethyloethane trimethacrylates, tetramethylene glycol dimethacryates, triethylene glycol dimethacrylates, tetraethylene glycol diacrylates, pentaerythritol diacrylates, pentaerythritol triacrylates, pentaerythritol tetraacrylates, dipentaerythritol diacrylates, dipentaerythritol triacrylates, dipentaerythritol tetraacrylates, dipentaerythritol pentaacrylates, dipentaerythritol hexaacrylates, tripentaerythritol octaacrylates, pentaerythritol dimethacrylates, pentaerythritol trimethacrylates, dipentaerythritol dimethacyrlates, dipentaerythritol tetramethacrylates, tripentaerythritol octamethacrylates, pentaerythritol diitaconates, dipentaerythritol trisitaconates, dipentaerythritol pentaitaconates, dipentaerythritol hexaitaconates, ethylene glycol diacrylates, 1,3-butanediol diacrylates, 1,3-butanediol dimethacrylates, 1,4-butanediol diitaconates, sorbitol triacrylates, sorbitol tetraacrylates, pentaerythritol modified triacrylates, sorbitol tetramethacrylates, sorbitol pentaacrylates, sorbitol hexaacrylates, oligoester acrylates and methacrylates, glycerol diacrylates and triacrylates, 1,4-cyclohexane diacrylates, bisacrylates and bismethacrylates of polyethylene glycol having a molecular weight of from 200 to 1,500, and mixtures thereof.

Suitable examples of the polymerizable compound include amides of one kind or amides of two or more different kinds of unsaturated carboxylic acids and aromatic, alicyclic or aliphatic polyamines preferably having from 2 to 6, particularly preferably from 2 to 4, amino groups.

Examples of the polyamine include ethylene diamines, 1,2- or 1,3-propylene diamines, 1,2-, 1,3- or 1,4-butylene diamines, 1,5-pentylene diamines, 1,6-hexylene diamines, octylene diamines, dodecylene diamines, 1,4-diaminocyclohexanes, isophorone diamines, phenylene diamines, bisphenylene diamines, di-β-aminoethyl ethers, diethylene triamines, triethylene tetramines and di(β-aminoethoxy)- or di(β-aminopropoxy)ethanes. Furthermore, polymers or copolymers further having an amino group, preferably on a side chain thereof, and oligoamides having an amino end group are preferred. Examples of the unsaturated polyamide include methylene bisacrylamides, 1,6-hexamethylene bisacrylamides, diethylene triamine trismethacrylamides, bis(methacrylamide propoxy)ethanes, β-methacrylamideethyl methacrylates and N-((β-hydroxyethoxy)ethyl)acrylamides.

Suitable examples of the unsaturated polyester and polyamide can be derived from maleic acid and a diol or a diamine. A certain proportion of the maleic acid can be substituted by other dicarboxylic acids. These may be used with an ethylenic unsaturated comonomer, such as styrene.

The polyester and the polyamide can be derived from dicarboxylic acids and from ethylenic unsaturated diols or diamines, and particularly from those having a relatively long chain, such as those having from 6 to 20 carbon atoms. Examples of the polyurethane include those constituted with saturated or unsaturated diisocyanates and unsaturated or saturated diols.

The polybutadienes, the polyisoprenes and the copolymers thereof are known in the art. Suitable examples of the comonomer include olefins, such as ethylenes, propenes, butenes and hexyenes, (meth)acrylates, acrylonitriles, styrenes and vinyl chlorides. The polymer having a (meth)acrylate group on a side chain thereof is also known in the art. It can be obtained, for example, as a reaction product of epoxy resins based on novolaks and (meth)acrylic acids, homo- or copolymers of vinyl alcohol or (meth)acrylic acids and esterified hydroxyalkyl derivatives thereof, or homo- or copolymers of a (meth)acrylate that is esterified with a hydroxyalkyl (meth)acrylate.

The polymerizable compound may have a site exhibiting other functions in the structure thereof, depending on the purpose of the photopolymerizable composition. For example, in the case where the photopolymerizable composition is utilized in a recording material, the compound may have a site, which accelerates the coloring reaction of the coloring component constituting an image portion, and a site, which suppresses coloration. These will be described later.

The total content of the polymerizable compound is preferably from 30.0 to 99.9% by weight, and more preferably from 50.0 to 90.0% by weight, of the total solid content of the photopolymerizable composition.

When the content is less than 30.0% by weight, a latent image might not form in the exposing step, and when it exceeds 99.9% by weight, a considerable reduction in recording density may occur.

Photopolymerization Initiator

The photopolymerization initiator contains a spectral sensitizing compound having a maximum absorption wavelength in a region of from 300 to 1,000 nm and a compound, which interacts with the spectral sensitizing compound. A single compound may be used as both the spectral sensitizing compound and the compound, which interacts with the spectral sensitizing compound.

As the spectral sensitizing compound having a maximum absorption wavelength of from 300 to 1,000 nm, a spectral sensitizing dye having a maximum absorption wavelength in that region is preferred.

In order to increase the sensitivity of the recording material, the spectral sensitizing dye is selected such that the wavelength of light irradiated from the light source used coincides with or is in the vicinity of the maximum absorption wavelength.

As the spectral sensitizing dye, known compounds disclosed in: "Research Disclosure", vol. 200, item 20036, December 1980; K. Tokumaru and M. Ogawara ed., "Zoukanzai" (Sensitizers), pp. 160–163, Kodansha Ltd., 1987; JP-A No. 3-87827 and No. 4-211252 can be used.

Specific examples thereof include 3-ketocoumarin compounds disclosed in JP-A No. 58–15603, thiopyrylium salts disclosed in JP-A No. 58-40302, naphthothiazole merocyanine compounds disclosed in JP-B No. 59-28328 and No. 60-53300, and merocyanine compounds disclosed in JP-B No. 61-9621, No. 62-3842, JP-A No. 59-89303 and No. 60-60104.

Dyes disclosed in "Kinousei Sikiso no Kagaku" (Chemistry of Functional Dyes), pp. 393–416, CMC Press 1981; and, "Shikizai" (Coloring Materials), vol. 60(4), pp. 212–224; (1987) can also be exemplified, and specific examples thereof include a cationic methine dye, a cationic carbonium dye, a cationic quinonimine dye, a cationic indoline dye and a cationic stylyl dye.

The following are also included in the spectral sensitizing dye, keto dyes, such as coumarin (including ketocoumarin and sulfocoumarin) dyes, merostyryl dyes, oxonole dyes and hemioxonole dyes; non-keto dyes, such as non-ketopolymethine dyes, triarylmethane dyes, xanthene dyes, anthracene dyes, rhodamine dyes, acridine dyes, aniline dyes and azo dyes; non-ketopolymethine dyes, such as azomethine dyes, cyanine dyes, carbocyanine dyes, dicarbocyanine dyes, tricarbocyanine dyes, hemicyanine dyes and styryl dyes; and quinonimine dyes, such as azine dyes, oxazine dyes, thiazine dyes, quinoline dyes and thiazole dyes.

The spectral sensitivity of the photopolymerization initiator used in the recording material of the invention can be obtained for a region from ultraviolet to infrared by appropriately using the spectral sensitizing dye.

The spectral sensitizing dye may be used singly or may be used in combinations of two or more.

The spectral sensitizing dye is preferably used in an amount of from 0.1 to 5% by weight, and more preferably in an amount of from 0.5 to 2% by weight, based on the total weight (solid content) of the photosensitive and heat-sensitive recording layer.

The compound, which interacts with the spectral sensitizing compound, can initiate polymerization of the polymerizable group contained in the compound B or the compound C (the photopolymerizable monomer). When the compound is made to co-exist with the spectral sensitizing compound, the recording material effectively responds to the exposing light source, which has a wavelength in the spectral absorption wavelength region, whereby high sensitivity can be obtained, and the formation of radicals can be controlled by using an arbitrary light source in regions from ultraviolet to infrared.

Examples of the compound exerting mutual action with the spectral sensitizing compound include an organic boron compound and compounds disclosed in JP-A No. 3-87827, No. 4-211252, and paragraphs (0145) to (0151) of Japanese Patent Application No. 11-36308.

Organic Boron Compound

The amount of the organic boron compound in the photopolymerizable composition, relative to the content of the compound having an ethylenic unsaturated bond, is preferably from 0.01 to 20% by weight, and more preferably from 0.1 to 10% by weight. However, the preferred amount varies depending on the kind of the "polymerizable compound" to be used therewith, and therefore is not limited to these ranges.

The coated amount of the photopolymerizable composition per one layer of the recording layer is preferably from 1 to 30 g/m$^2$, and more preferably from 2 to 10 g/m$^2$. When the coated amount is less than 1 g/m$^2$, a sufficient coloring density might not be obtainable, and when it exceeds 30 g/m$^2$, the coating appropriateness might deteriorate.

Coloring Component

The coloring component contained in the recording layer will be described.

In the recording material of the invention, the recording layer contains the coloring component A and the compound B (coloring component B) as a coloring source.

Examples of the combination of the coloring component A and the coloring component B as the coloring source constituting the image part include the following combinations (a) to (s). In the following combinations, the coloring component A and the coloring component B are given in sequential order.

(a) An electron-donating dye precursor and an electron-accepting compound (b) A diazo compound and a coupling component (hereinafter referred to as a "coupler compound")

(c) A metallic salt of an organic acid, such as silver behenate and silver stearate, and a reducing agent, such as protocatechinic acid, spiroindane and hydroquinone (d) An iron salt of a long-chain fatty acid, such as ferric stearate and ferric myristate, and a phenol, such as tannic acid, gallic acid and ammonium salicylate (e) A heavy metal salt of an organic acid, such as nickel, cobalt, lead, copper, iron, mercury and silver salts of acetic acid, stearic acid and palmitic acid, and a sulfide of an alkali metal or an alkaline earth metal, such as calcium sulfide, strontium sulfide and potassium sulfide, and combination of the heavy metal salt of an organic acid and an organic chelating agent, such as s-diphenylcarbazide and diphenylcarbazone (f) A sulfate of a heavy metal, such as sulfates of silver, lead, mercury and sodium, and a sulfur compound, such as sodium tetrathionate, sodium thiosulfate and thiourea (g) An aliphatic ferric acid, such as ferric stearate, and an aromatic polyhydroxy compound, such as 3,4-hydroxytetraphenylmethane (h) A metallic salt of an organic acid, such as silver oxalate and mercury oxalate, and an organic polyhydroxy compound, such as polyhydroxy alcohol, glycerin and glycol (i) A ferric salt of a fatty acid, such as ferric pelargonate and ferric laurate, and thiosemicarbazide and a thiosemicarbazide derivative (j) A lead salt of an organic acid, such as lead caproate, lead pelargonate and lead behenate, and a thiourea derivative, such as ethylene thiourea and N-dodecyl thiourea (k) A higher aliphatic heavy metal salt, such as ferric stearate and copper stearate, and zinc dialkyldithiocarbamate (l) An oxazine dye, formed by a combination such as a combination of resorcin and a nitroso compound (m) A formazan compound and a reducing agent and/or a metallic salt (n) A protected precursor of a dye (or a leuco dye) and a deprotecting agent (o) An oxidizable coloring agent and an oxidizing agent (p) A phthalonitrile and a diiminoisoindoline (i.e., a combination forming phthalocyanine)

(q) An isocyanate and a diiminoindoline (i.e., a combination forming a colored pigment)

(r) A pigment precursor and an acid or a base (i.e., a combination forming a pigment)

(s) An oxidant precursor of a paraphenylene diamine derivative or a paraaminophenol derivative and a coupling component (coupling compound)

Preferred examples of the combination of two components as the coloring source include (a) the combination of an electron-donating dye precursor and an electron-accepting compound, (b) the combination of a diazo compound and a coupling component (hereinafter referred to as a "coupling compound") (n) the combination of a protectedprecursor of a dye (or a leuco dye) and a deprotecting agent, and (s) the combination of an oxidant precursor of a paraphenylene diamine derivative or a paraaminophenol derivative and a coupling component (coupling compound).

In the case where an electron-donating colorless dye precursor is used as the coloring component A, examples of the electron-donating colorless dye precursor include various compounds, such as phthalide compounds, fluoran compounds, phenothiazine compounds, indolylphthalide compounds, leucoauramine compounds, rhodamine lactam compounds, triphenylmethane compounds, triazene compounds, spiropyran compounds, pyridine and pyrazine compounds, and fluorene compounds.

Examples of the phthalide compounds include those compounds that are disclosed in U.S. Reissue Pat. No. 23,024, No. 3,491,111, No. 3,491,112, No. 3,491,116 and No. 3,509,174, and specific examples thereof include 3,3-bis(p-dimethylaminophenyl)-6-diemthylaminophthalides, 3,3-bis(p-diethylaminophenyl)phthalides, 3,3-bis(2-methyl-1-octylindole-3-yl)phthalides, 3-(4-dipropylamino-2-acetylaminophenyl)-3-(2-methyl-1-octylindole-3-yl)-4-azaphthalides, 3-4-diethylamino-2-ethoxyphenyl)-3-(2-methyl-1-octylindole-3-yl)phthalides, 3-(4-diethylamino-2-ethoxyphenyl)-3-(2-methyl-1-octylindole-3-yl)-4-azaphthalides, 3-(4-diethylamino-2-methylphenyl)-3-(1-ethyl-2-methylindole-3-yl)-4-azaphthalides, 3,3-bis(4-diethylamino-2-butyloxyphenyl)-4-azaphthalides and 3-(4-diethylamino-2-butyloxyphenyl)-3-(2-methyl-1-pentylindole-3-yl)-4-azaphthalides.

Examples of the fluoran compound include those compounds that are disclosed in U.S. Pat. No. 3,624,107, No. 3,627,787, No. 3,641,011, No. 3,462,828, No. 3,681,390, No. 3,920,510 and No. 3,959,571, and specific examples thereof include 2-anilino-3-methyl-6-diethylaminofluorans, 2-anilino-3-methyl-6-dibutylaminofluorans, 2-anilino-3-methyl-6-N-ethyl-N-isoamylaminofluorans, 2-anilino-3-methyl-6-N-methyl-N-cyclohexylaminofluorans, 2-anilino-3-methyl-6-N-ethyl-N-isobutylaminofluorans, 2-anilino-6-dibutylaminofluorans and 2-anilino-3-methyl-6-N-methyl-N-tetrahydrofurfurylaminofluorans.

Examples of the thiazine compounds include benzoyl leuco methylene blue and p-ntirobenzoyl leuco methylene blue.

Examples of the leucoauramine compounds include 4,4'-bis-dimethylaminobenzhydrine benzylethers, N-halophenyl-leucoauramines and N-2,4,5-trichlorophenyl leucoauramines.

Examples of the rhodamine lactam compounds include rhodamine-B-anilinolactams and rhodamine-(p-anilino) lactams.

Examples of the spiropyran compounds include those compounds that are disclosed in U.S. Pat. No. 3,971,808, and specific examples thereof include 3-methyl-spiro-dinaphthopyrans, 3-ethyl-spiro-dinaphthopyrans, 3,3'-dichloro-spiro-dinaphthopyrans, 3-benzyl-spiro-dinaphthopyrans, 3-methyl-naphtho-(3-methoxybenzo) spiropyrans and 3-propyl-spiro-dibenzopyrans.

Examples of the pyridine and pyradine compound include those compounds that are disclosed in U.S. Pat. No. 3,775,424, U.S. Pat. No. 3,853,869 and U.S. Pat. No. 4,246,318.

Examples of the fluorene compound include those compounds that are disclosed in Japanese Patent Application No. 61-240989.

As the dye precursor coloring cyan, magenta or yellow, those dye precursors that are disclosed in U.S. Pat. No. 4,800,149 can be used.

As the electron-donating dye precursor for a yellow coloring dye, those dye precursors that are disclosed in U.S. Pat. No. 4,800,148, No. 5,126,233 and JP-B No. 7-88105 can be used, and as the electron-donating dye precursor for a cyan coloring dye, those dye precursors that are disclosed in JP-A No. 63-53542 can be used.

In the case where the electron-donating dye precursor is used, an electron-accepting compound is used as the coloring component B that colors the electron-donating dye precursor.

Examples of the electron-accepting compound include those electron-accepting compounds that are known in the fields of heat-sensitive paper and pressure-sensitive paper, such as a phenol derivatives, salicylic acid derivatives, metallic salts of aromatic carboxylic acids, acid clays, bentonites, novolak resins, metal-treated novolak resins and metallic complexes. Specific examples thereof include those disclosed in JP-B No. 40-9309, No. 45-14039, JP-A No. 52-140483, No. 48-51510, No. 57-210886, No. 58-87089, No. 59-11286, No. 60-176795 and No. 61-95988.

Among the foregoing compounds, examples of the phenol derivative include 2,2-bis(4-hydroxyphenyl)propanes, 1,1-bis(3-chloro-4-hydroxyphenyl)cyclohexanes, 4-hydroxyphenyl-4'-isopropyloxyphenylsulfones, bis(3-allyl-4-hydroxyphenyl)sulfones, α,α'-bis(4-hydroxyphenyl)-1,4-diisopropylbenzenes and benzyl p-hydroxybenzoates.

Examples of the salicylic acid derivatives include 4-pnetadecylsalicylic acids, 3,5-di(α-methylbenzyl)salicylic acid, 3,5-di(tert-octyl)salicylic acid, 5-octadecylsalicylic acids, 5-α-(p-α-methylbenzylphenyl)ethylsalicylic acids, 3-α-methylbenzyl-5-tert-octylsalicylic acids, 5-tetradecylsalicylic acids, 4-hexyloxysalicylic acids, 4-cyclohexyloxysalicylic acids, 4-decyloxysalicylic acids, 4-dodecyloxysalicylic acids, 4-pentadecyloxysalicylic acids, 4-octadecyloxysalicylic acids, and zinc, aluminum, calcium or copper salts thereof.

In the recording material of the first embodiment, the coloring component B also functions as the compound having a polymerizable group. Therefore, at least one of the polymerizable compound of the recording material of the first embodiment is an electron-accepting compound, and contains an electron-accepting group and an ethylenic unsaturated bond (hereinafter referred to as a "polymerizable group") in the molecule thereof.

Examples of the coloring component B in this case include those compounds that can be synthesized with reference to 3-halo-4-hydroxybenzoic acid disclosed in JP-A No. 4-226455, a methacryloxyethyl esters and acryloxyethyl ester of benzoic acids having a hydroxyl group disclosed in JP-A No. 63-173682, esters of benzoic acid having a hydroxyl group and hydroxymethylstyrene disclosed in JP-A No. 59-83693, No. 60-141587 and No. 62-99190, hydroxystyrene disclosed in European Patent No. 29,323, an N-vinylimidazole complex of zinc halogenate disclosed in JP-A No. 62-167077 and No. 62-16708, and an electron-accepting compound disclosed in JP-A No. 63-317558.

Among the compounds having an electron-accepting group and a polymerizable group in one molecule, a 3-halo-4-hydroxybenzoic acid represented by the following formula is preferred.

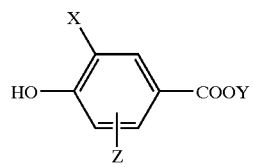

In the formula, X represents a halogen atom, and a chlorine atom is preferred. Y represents a monovalent group having an ethylenic polymerizable group, and an aralkyl group having a vinyl group, an acryloyloxyalkyl group and a methacryloyloxyalkyl group are preferred, with an acryloyloxyalkyl group having from 5 to 11 carbon atoms and a methacryloyloxyalkyl group having from 6 to 12 carbon atoms being more preferred. Z represents a hydrogen atom, an alkyl group or an alkoxy group.

Examples of the 3-halo-4-hydroxybenzoic acid include vinylphenethyl 3-chloro-4-hydroxybenzoates, vinylphenylpropyl 3-chloro-4-hydroxybenzoates, 2-acryloyloxyethyl 3-chloro-4-hydroxybenzoates, 2-methacryloyloxyethyl 3-chloro-4-hydroxybenzoates, 2-acryloyloxypropyl 3-chloro-4-hydroxybenzoates, 2-methacryloyloxypropyl 3-chloro-4-hydroxybenzoates, 3-acryloyloxypropyl 3-chloro-4-hydroxybenzoates, 3-methacryloyloxypropyl 3-chloro-4-hydroxybenzoates, 4-acryloyloxybutyl 3-chloro-4-hydroxybenzoates, 4-methacryloyloxy 3-chloro-4-hydroxybenzoates, 2-acryloyloxyethyl 3-chloro-4-hydroxybenzoates, 5-acryloyloxypentyl 3-chloro-4-hydroxybenzoates, 5-methacryloyloxypentyl 3-chloro-4-hydroxybenzoates, 6-acryloyloxyhexyl 3-chloro-4-hydroxybenzoates, 6-methacryloyloxyhexyl 3-chloro-4-hydroxybenzoates, 8-acryloyloxyoctyl 3-chloro-4-hydroxybenzoates and 8-methacryloyloxyoctyl 3-chloro-4-hydroxybenzoates.

Further preferred examples thereof include styrene sulfonyl aminosalicylic acids, vinylbenzyloxyphthalic acids, zinc β-methacryloxyethoxysalicylates, zinc β-acryloxyethoxysalicylates, vinyloxyethyloxybenzoic acids, β-methacryloxyethyl orseillinates, β-acryloxyethyl orseillinates, β-methacryloxyethoxyphenols, β-acryloxyethoxyphenols, β-methacryloxyethyl-β-resorcinates, β-acryloxyethyl-β-resorcinates, hydroxystyrene sulfonic acid-N-ethylamides, β-methacryloxypropyl-p-hydroxybenzoates, β-acryloxypropyl-p-hydroxybenzoates, metahcryloxymethylphenols, acryloxymethylphenols, methacrylamide propanesulfonic acids, acrylamide propanesulfonic acids, β-methacryloxyethoxy-dihydroxybenzenes, β-acryloxyethoxy-dihydroxybenzenes, γ-styrenesulfonyloxy-β-methacryloxypropanecarboxylic acids, γ-acryoxypropyl-α-hydroxyethyloxysalicylic acids, β-hydroxyethoxyphenols, β-methacryoxyethyl-p-hydroxycinnamates, β-acryoxyethyl-p-hydroxycinnamates, 3,5-distyrenesulfonic acid amide phenols, methacryloxyethoxyphthalic acid, acryloxyethoxyphthalic acids, methacrylic acids, acrylic acids, methacryloxyethoxyhydroxynaphthoic acids, acryloxyethoxyhydroxynaphthoic acids, 3-β-hydroxyethoxyphenols, β-methacryloxyethyl-p-hydroxybenzoates, β-acryloxyethyl-p-hydroxybenzoates, β'-methacryloxyethyl-β-resorcinates, β-methacryloxyethyloxycarbonylhydroxy benzoic acids, β-acryloxyethyloxycarbonylhydroxy benzoic acids, N,N'-di-β-methacryloxyethylaminosalicylic acids, N,N'-di-β-acryloxyethylaminosalicylic acids, N,N'-di-β-methacryloxyethylaminosulfonylsalicylic acids, N,N'-di-β-acryloxyethylaminosulfonylsalicylic acids and metallic salts (such as a zinc salt) thereof.

In the case where an electron-donating dye precursor is used as the coloring component A, and an electron-accepting compound is used as the coloring component B, the amount of the electron-donating dye precursor in the recording layer is preferably from 0.05 to 5 g/m², and more preferably from 0.1 to 3 g/m².

The amount of the electron-accepting compound used is preferably from 0.5 to 20 parts by weight, and more preferably from 3 to 10 parts by weight, per 1 part by weight of the electron-donating colorless dye used. When the amount of the election acceptor compound used is less than 0.5 part by weight, a sufficient coloring density might not cannot be obtainable, and when it exceeds 20 parts by weight, reduction in sensitivity and deterioration of coating suitability may occur.

In the case where a diazo compound is used as the coloring component A, on the other hand, a compound represented by the following formula is preferably used.

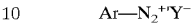

In the formula, Ar represents an aromatic ring group, and Y- represents an acid anion.

In the formula, Ar represents a substituted or unsubstituted aryl group, Examples of the substituent include alkyl groups, alkoxy groups, alkylthio groups, aryl groups, aryloxy groups, arylthio groups, acyl groups, alkoxycarbonyl groups, carbamoyl groups, carboamide groups, sulfonyl groups, sulfamoyl groups, sulfoneamide groups, ureido groups, a halogen atom, amino groups and heterocyclic groups, and these substituents may be further substituted.

As the aryl group, an aryl group having from 6 to 30 carbon atoms is preferred, and examples thereof include phenyl groups, 2-methylphenyl groups, 2-chlorophenyl groups, 2-methoxyphenyl groups, 2-butoxyphenyl groups, 2-(2-ethylhexyloxy)phenyl groups, 2-octyloxyphenyl groups, 3-(2,4-di-t-pentylphenoxyethoxy)phenyl groups, 4-chlorophenyl groups, 2,5-dichlorophenyl groups, 2,4,6-trimethylphenyl groups, 3-chlorophenyl groups, 3-methylphenyl groups, 3-methoxyphenyl groups, 3-butoxyphenyl groups, 3-cyanophenyl groups, 3-(2-ethylhexyloxy)phenyl groups, 3,4-dichlorophenyl groups, 3,5-dichlorophenyl groups, 3,4-dimethoxyphenyl groups, 3-(dibutylaminocarbonylmethoxy)phenyl groups, 4-cyanophenyl groups, 4-methylphenyl groups, 4-methoxyphenyl groups, 4-butoxyphenyl groups, 4-(2-ethylhexyloxy)phenyl groups, 4-benzylphenyl groups, 4-aminosulfonylphenyl groups, 4-N,N-dibutylaminosulfonylphenyl groups, 4-ethoxycarbonylphenyl groups, 4-(2-ethylhexylcarbonyl)phenyl groups, 4-fluorophenyl groups, 3-acetylphenyl groups, 2-acetylaminophenyl groups, 4-(4-chlorophenylthio)phenyl groups, 4-(4-methylphenyl)thio-2,5-butoxyphenyl groups and 4-(N-benzyl-N-methylamino)-2-dodecyloxycarbonylphenyl groups.

These groups may be further substituted, for example, by alkyloxy groups, alkylthio groups, substituted phenyl groups, cyano groups, substituted amino groups, a halogen atom and heterocyclic groups.

Examples of a diazo group that can be preferably used as the coloring component A include those diazo groups that are disclosed in paragraphs 44 to 49 of JP-A No. 7-276808. However, the invention is not limited to these compounds.

The maximum absorption wavelength $\lambda_{max}$ of the diazo compound is preferably 450 nm or less in view of the effect, and more preferably from 290 to 440 nm. It is preferable that the diazo compound have 12 or more carbon atoms, a solubility in water of 1% or less and a solubility in ethyl acetate of 5% or more.

The diazo compound as the coloring component A may be used singly or may be used as a combination of two or more kinds thereof for various purposes, such as hue adjustment.

In the case where the diazo compound is used, a coupler compound (having no polymerizable group) or a coupler compound having a polymerizable group is used as the coloring component B.

Both the coupler compounds form a dye by coupling with the diazo compound in a basic atmosphere and/or a neutral atmosphere, and it can be used as a combination of two or more kinds thereof for various purposes, such as hue adjustment.

Specific examples of the coupler compound having a polymerizable group include so-called active methylene groups having a methylene group adjacent to a carbonyl group, phenol derivatives, naphthol derivatives, azole derivatives and a condensed heterocyclic azole derivatives. These may be used after appropriate selection within a range that conforms to the objects of the present invention.

Examples of a coupler skeleton compound (coupler) in the coupler compound having a polymerizable group include those couplers, such as a so-called active methylene groups having a methylene group adjacent to a carbonyl group, phenol derivatives, naphthol derivatives, azole derivatives and condensed heterocyclic azole derivatives. Specific examples thereof include resorcins, fluoroglycins, 2,3-dihydroxynaphthalenes, sodium 2,3-dihydroxynaphthalene-6-sulfonates, 1-hydroxy-2-naphthoic acid morpholinopropylamides, sodium 2-hydroxy-3-naphthalenesulfonates, 2-hydroxy-3-naphthalenesulfonic acid anilides, 2-hydroxy-3-naphthalenesulfonic acid morpholinopropylamides, 2-hydroxy-3-naphthalenesulfonic acid 2-ethylhexyloxypropylamides, 2-hydroxy-3-naphthalenesulfonic acid 2-ethylhexylamides, 5-acetamide-1-naphthols, sodium 1-hydroxy-8-acetamidenaphthalene-3,6-disulfonates, 1-hydroxy-8-acetamidenaphthalene-3,6-disulfonic acid anilides, 1,5-dihydroxynaphthalenes, 2-hydroxy-3-naphthoic acid morpholinopropylamides, 2-hydroxy-3-naphthoic acid octylamides, 2-hydroxy-3-naphtoic acid anilides, 5,5-dimethyl-1,3-cyclohexanedions, 1,3-cyclopentanediones, 5-(2-n-tetradecyloxyphenyl)-1,3-cyclohexanediones, 5-phenyl-4-methoxycarbonyl-1,3-cyclohexanediones, 5-(2,5-di-n-octyloxyphenyl)-1,3-cyclohexanediones, N,N'-dicyclohexylbarbituric acids, N,N'-di-n-dodecylbarbituric acids, N-n-octyl-N'-n-octadecylbarbituric acids, N-phenyl-N'-(2,5-di-n-octyloxyphenyl)barbituric acids, N,N'-bis(octadecyloxycarbonylmethyl)barbituric acids, 1-phenyl-3-methyl-5-pyrazolones, 1-(2,4,6-trichlorophenyl)-3-anilino-5-pyrazolones, 1-(2,4,6-trichlorophenyl)-3-benzamide-5-pyrazolones, 6-hydroxy-4-methyl-3-cyano-1-(2-ethylhexyl)-2-pyridones, 2,4-bis(benzoylacetamide)toluenes, 1,3-bis(pivaloylacetamidemethyl)benzenes, benzoylacetonitriles, thenoylacetonitriles, acetanilides, benzoylacetanilides, pivaloylacetanilides, 2-chloro-5-(N-n-butylsulfamoyl)-1-pyvaloylacetamide benzenes, 1-(2-ethylhexyloxypropyl)-3-cyano-4-methyl-6-hydroxy-1,2-dihydropyridine-2-ones, 1-(dodecyloxypropyl)-3-acetyl-4-methyl-6-hydroxy-1,2-dihydropyridine-2-ones and 1-(4-n-octyloxyphenyl)-3-tert-butyl-5-aminopirazoles.

The coupler compounds are also described in detail in JP-A No. 4-201483, No. 7-223367, No. 7-223368, No. 7-323660, No. 5-278608, No. 5-297024, No. 6-18669, No. 6-18670, No.7-316280, No. 9-216468, No. 9-216469, No. 9-319025, No. 10-035113, No. 10-193801 and No. 10-264532.

The coupler compound forms a dye by coupling with the diazo compound in a basic atmosphere and/or a neutral atmosphere, and may be used in combination of plurality thereof for various purposes, such as hue adjustment.

Specific examples of the coupler having a polymerizable group will be shown below, but the invention is not limited to them.

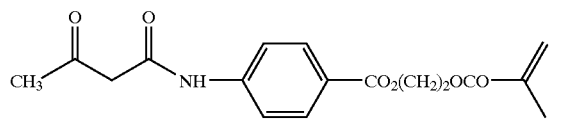

B-1

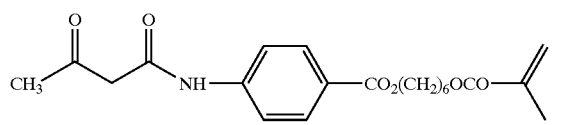

B-2

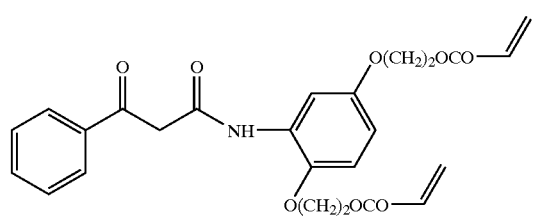

B-3

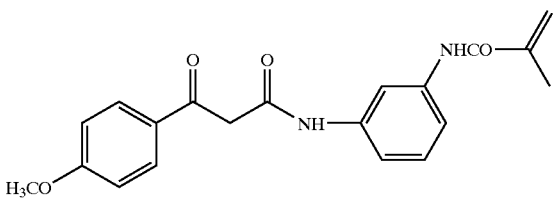

B-4

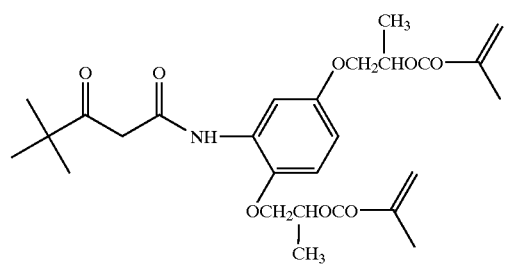

B-5

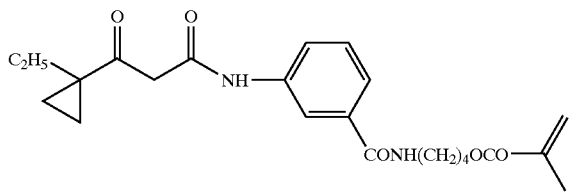

B-6

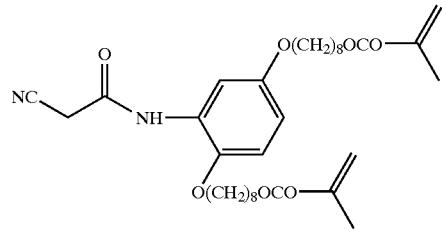

B-7

B-8
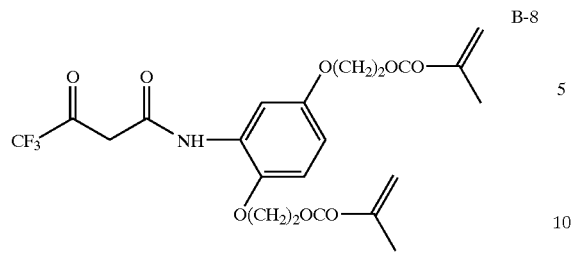
B-9
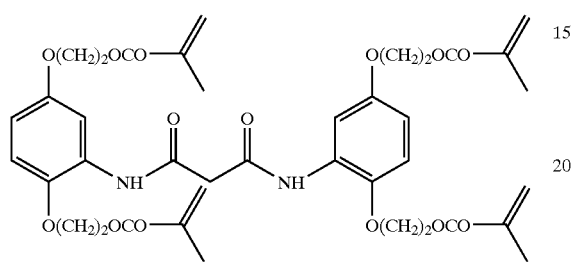
B-10
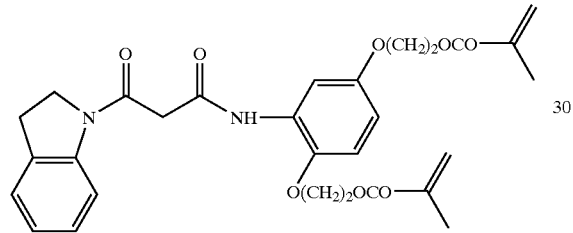
B-11
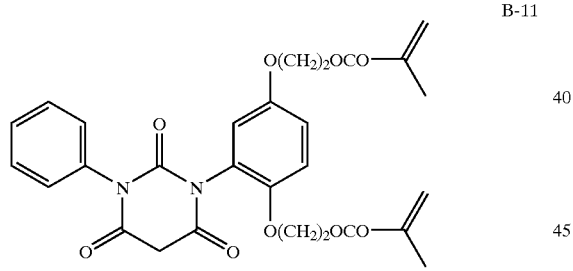
B-12
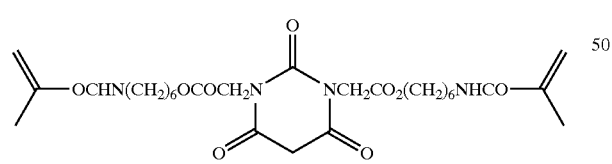
B-13
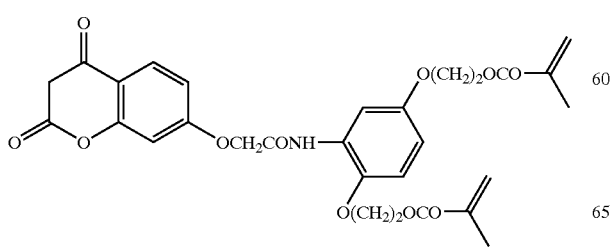
B-14
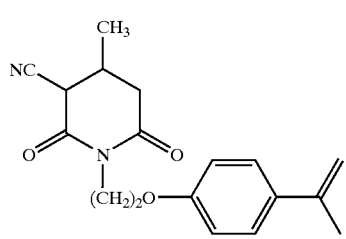
B-15
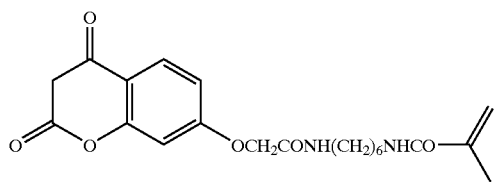
B-16
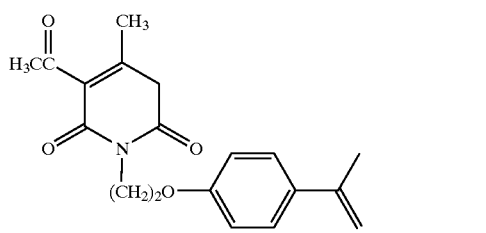
B-17
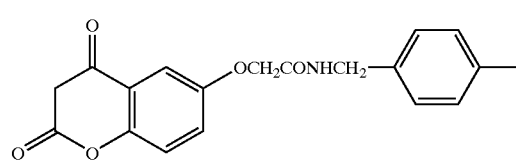
B-18
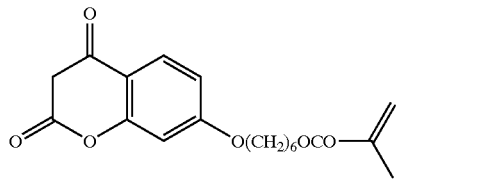
B-19
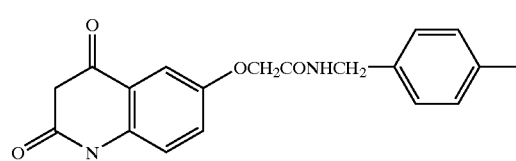
B-20
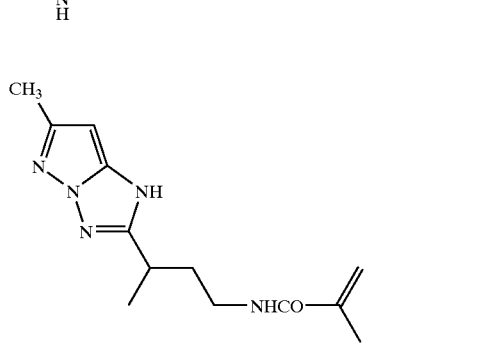

B-21
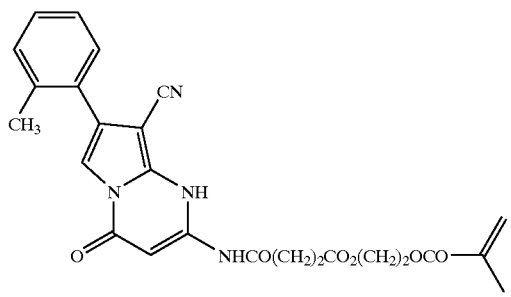
B-26
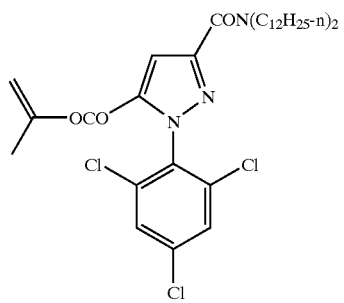
B-22
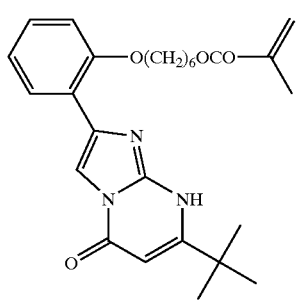
B-27
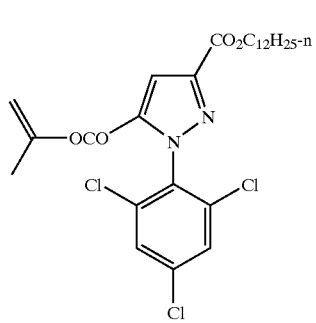
B-23
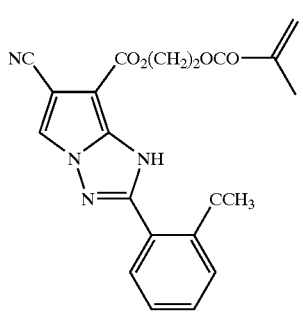
B-28
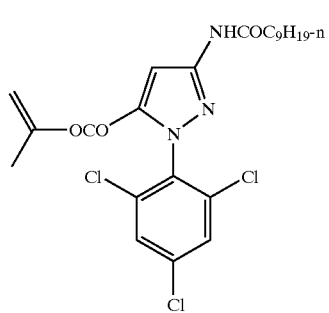
B-24
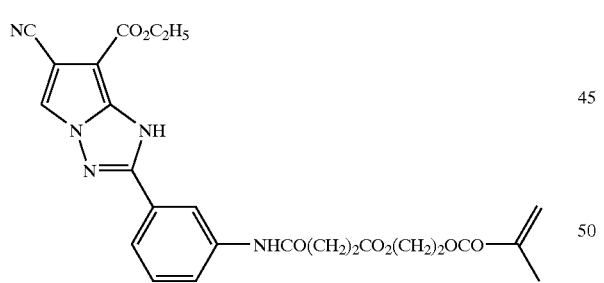
B-29
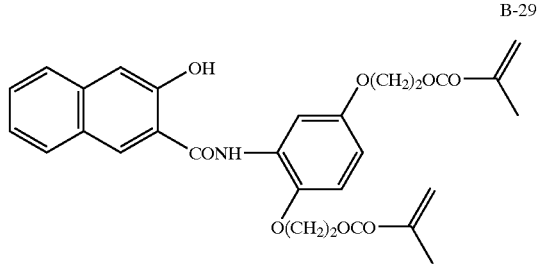
B-25
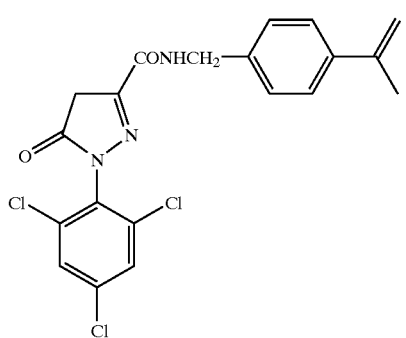
B-30
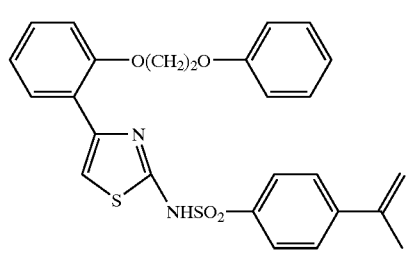

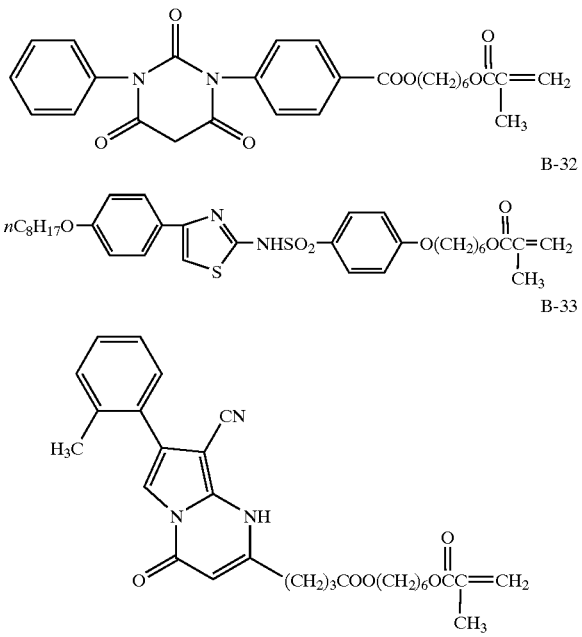

Examples of the coupler having no polymerizable group include those compounds enumerated as the coupler skeleton compounds of the coupler compound having a polymerizable group.

In the case where a diazo compound is used as the coloring component A, and a coupler is used as the coloring component B, the amount of the diazo compound in the recording layer is preferably from 0.02 to 5.0 g/m$^2$, and more preferably from 0.05 to 3.0 g/m$^2$.

When the content is less than 0.02 g/m$^2$, a sufficient coloring density might not be obtainable, and when it exceeds 5.0 g/m$^2$, the coating suitability of the coating composition may deteriorate.

The amount of the coupler compound used is preferably from 0.5 to 20 parts by weight, and more preferably from 1 to 10 parts by weight, per 1 part by weight of the diazo compound. When the amount used is less than 0.5 part by weight, sufficient coloring property might not be obtainable, and when it exceeds 20 parts by weight, the coating suitability may deteriorate.

The coupler compound can be used as the coloring component B by adding a water-soluble polymer along with other components, followed by solid dispersion by a sand mill or the like, and can be also used as an emulsified product by emulsifying with a suitable emulsifying assistant. The method for solid dispersion or emulsification is not particularly limited, and known methods may be employed. The methods are described in detail in JP-A No. 59-190886, No. 2-141279 and No. 7-17145.

In order to accelerate the coupling reaction of the diazo compound and the coupler, it is preferred to use organic bases, such as tertiary amine compounds, a piperidine compounds, a piperazine compounds, amidine compounds, formamidine compounds, pyridine compounds, guanidine compounds on morpholine compounds.

Examples of the organic base include a piperazine compounds, such as N,N'-bis(3-phenoxy-2-hydroxypropyl) piperazine, N,N'-bis(3-(p-methylphenoxy)-2-hydroxypropyl)piperazine, N,N'-bis(3-(p-methoxyphenoxy)-2-hydroxypropyl)piperazine, N,N'-bis(3-phenylthio-2-hydroxypropyl)piperazine, N,N'-bis(3-(β-naphthoxy)-2-hydroxypropyl)piperazine, N-3-(β-naphthoxy)-2-hydroxypropyl-N'-methylpiperazine and 1,4-bis((3-(N-methylpiperazino)-2-hydroxy)propyloxy) benzene, morpholine compounds, such as N-(3-(β-naphthoxy)-2-hydroxy)propylmorpholine, 1,4-bis((3-morpholino-2-hydroxy)propyloxy)benzene and 1,3-bis((3-morpholino-2-hydroxy)propyloxy)benzene, piperidine compounds, such as N-(3-phenoxy-2-hydroxypropyl) piperidine and N-dodecylpiperidine, triphenylguanidines, tricyclohexylguanidines, dicyclohexylphenylguanidines, 2-N-methyl-N-benzylaminoethyl 4-hydroxybenzoates, 2-N,N-di-n-butylaminoethyl 4-hydroxybenzoates, 4-(3-N,N-dibutylaminopropoxy)benzene sulfonamides and 4-(2-N,N-dibutylaminoethoxycarbonyl)phenoxyacetic acid amides.

These organic bases can be used singly or in combinations of two or more.

These are organic bases disclosed in JP-A No. 57-123086, No. 60-49991, No. 60-94381, Japanese Patent Application No. 7-228731, No. 7-235157 and No. 7-235158.

In the case where an organic base is used, an organic base having a polymerizable group may be used as the organic base.

In the case where an organic base having a polymerizable group is used in the recording medium of the first embodiment, both the diazo compound and the coupler may be encapsulated in the microcapsules as the coloring component A, and the organic base having a polymerizable group is used as the coloring component B. In the case where both the diazo compound and the coupler are encapsulated in the microcapsules as the coloring component A, a combination of the diazo compound and the coupler is used such that a coloring reaction does not occur unless a base is present.

In the recording material of the first embodiment, the diazo compound may be used as the coloring component A, and the coupler having a polymerizable group and the organic base having a polymerizable group may be used in combination as the coloring component B.

The using amount of the organic base used is not particularly limited, and is preferably in a range of from 1 to 30 mole per 1 mole of the diazo compound.

A coloring assistant may be added in order to accelerate the coloring reaction. Examples of the coloring assistant include phenol derivatives, naphthol derivatives, alkoxy-substituted benzenes, alkoxy-substituted naphthalenes, hydroxyl compounds, carboxylic amide compounds and sulfonamide compounds.

The polymerizable compound used in the recording material of the second embodiment will be described.

In the recording material of the first embodiment, the recording layer contains a coloring component A and a compound C, which has a site that suppresses a reaction of the coloring component A and the coloring component B, which colors when reacted with the coloring component A and a polymerizable group in one molecule (hereinafter sometimes referred to as a "polymerizable coloration suppressing compound"), as polymerizable compounds.

In the case where an electron-donating dye precursor is used as the coloring component A, and an electron-accepting compound having no polymerizable group is used as the coloring component B, the compound C used is preferably a photopolymerizable monomer, which has at least one vinyl group and a site that suppresses between reaction of the electron-donating dye precursor and the electron-accepting compound in one molecule (hereinafter sometimes referred to as a "photopolymerizable monomer $D_1$").

Specific examples of the photopolymerizable monomer $D_1$ include acrylic acids and salts thereof, acrylates, acrylamides, methacrylic acids and salts thereof, methacrylates, methacrylamides, maleic anhydrides, maleates, itaconic acids, itaconates, styrene compounds, vinyl ether compounds, vinyl ester compounds, N-vinyl heterocyclic compounds, allyl ether compounds and allyl ester compounds.

Among these, a compound having maltiple vinyl groups in one molecule is preferred, and specific preferred examples thereof include acrylates and methacrylates of a polyvalent alcohol, such as trimethylolpropanes and pentaerythritols; acrylates and methacrylates of polyvalent phenol and bisphenols, such as resorcinols, pyrogallols and fluoroglycinols; epoxy resins terminated with an acrylate or a methacrylate; and polyesters terminated with an acrylate or a methacrylate.

Among these, ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate and diethylene glycol dimethacryalte are particularly preferred.

the photopolymerizable monomer $D_1$ preferably has a molecular weight of from about 100 to 5,000, and more preferably from about 300 to 2,000.

In the case where the photopolymerizable monomer $D_1$ is used as the compound C, the amount thereof used is preferably from 0.1 to 10 parts by weight, and more preferably from 0.5 to 5 parts by weight, per 1 part by weight of the electron-donating compound used in combination with the coupler compound, which has no polymerizable group. When the amount used is less than 0.1 part by weight, a latent image might not cannot be formable in the exposing step, and when it exceeds 10 parts by weight, the coloring density may decreased.

In the case where a diazo compound is used as the coloring component A, and a coupler compound having no polymerizable group is used as the coloring component B, the compound C used is preferably a photopolymerizable monomer having an acidic group, which suppresses a coupling reaction of the diazo compound and the coupler compound, and at least one vinyl group in one molecule (hereinafter sometimes referred to as a "photopolymerizable monomer $D_2$").

Preferred examples of the photopolymerizable monomer $D_2$ include styrene sulfonylaminosalicylic acids, vinylbenzyloxyphthalic acids, zinc β-methacryloxyethoxysalicylates, zinc β-acryloxyethoxysalicylates, vinyloxyethyloxybenzoic acids, β-methacryloxyethyl orseillinates, β-acryloxyethyl orseillinates, β-methacryloxyethoxyphenols, β-acryloxyethoxyphenols, β-methacryloxyethyl-β-resorcinates, β-acryloxyethyl-β-resorcinates, hydroxystyrene sulfonic acid-N-ethylamides, β-methacryloxypropyl-p-hydroxybenzoates, β-acryloxypropyl-p-hydroxybenzoates, metahcryloxymethylphenols, acryloxymethylphenols, methacrylamide propanesulfonic acids, acrylamide propanesulfonic acids, β-methacryloxyethoxy-dihydroxybenzenes, β-acryloxyethoxy-dihydroxybenzenes, γ-styrenesulfonyloxy-β-methacryloxypropanecarboxylic acids,
γ-acryoxypropyl-α-hydroxyethyloxysalicylic acids, β-hydroxyethoxyphenols, β-methacryoxyethyl-p-hydroxycinnamates, β-acryoxyethyl-p-hydroxycinnamates, 3,5-distyrenesulfonic acid amide phenols, methacryloxy-ethoxyphthalic acids, acryloxyethoxyphthalic acids, methacrylic acids, acrylic acids, methacryloxyethoxyhydroxynaphthoic acids, acryloxyethoxyhydroxynaphthoic acids, 3-β-hydroxyethoxyphenols, β-methacryloxyethyl-p-hydroxybenzoates, β-acryloxyethyl-p-hydroxybenzoates,
β'-methacryloxyethyl-β-resorcinates,
β-methacryloxyethyloxycarbonylhydroxy benzoic acids, β-acryloxyethyloxycarbonylhydroxy benzoic acids, N,N-di-β-methacryloxyethylaminosalicylic acids, N,N-di-β-acryloxyethylaminosalicylic acids, N,N-di-β-methacryloxyethylaminosulfonylsalicylic acids and N,N-di-β-acryloxyethylaminosulfonylsalicylic acids.

In the case where the photopolymerizable monomer $D_2$ is used as the compound C, the amount used is preferably from 0.1 to 10 parts by weight, and more preferably from 0.5 to 5 parts by weight, per 1 part by weight of the coupler compound used in combination with the coupler compound having no polymerizable group. When the using amount is less than 0.1 part by weight, a latent image might not be formable in the exposing step, and when it exceeds 10 parts by weight, the coloring density might decrease.

Microcapsules

In the recording material of the invention, the coloring component (for example, the electron-donating colorless dye or the diazonium salt compound) is used by encapsulating in microcapsules. As the method for microencapsulation, known methods can be used.

Examples thereof include a method utilizing coacervation of a hydrophilic wall forming material disclosed in U.S. Pat. No. 2,800,457 and No. 2,800,458, an interface polymerization method disclosed in U.S. Pat. No. 3,287,154, British Patent No. 990,443, JP-B No. 38-19574, No. 42-446 and No. 42-771, a method utilizing polymer deposition disclosed in U.S. Pat. No. 3,418,250 and No. 3,660,304, a method using an isocyanate polyol wall material disclosed in U.S. Pat. No. 3,796,669, a method utilizing an isocyanate wall material disclosed in U.S. Pat. No. 3,914,511, a method utilizing a urea-formaldehyde or urea-formaldehyde-resorcinol wall forming material disclosed in U.S. Pat. No. 4,001,140, No. 4,087,376 and No. 4,089,802, a method utilizing wall materials, such as a melamine-formaldehyde resin and hydroxypropylcellulose disclosed in U.S. Pat. No. 4,025,455, an in situ method by polymerization of a monomer disclosed in JP-B No. 36-9168 and JP-A No. 51-9079, an electrolytic dispersion cooling method disclosed in British Patent No. 952,807 and No. 965,074, and a spray drying method disclosed in U.S. Pat. No. 3,111,407 and British Patent No. 930,422.

The method for microencapsulation is not limited to these methods, and in the recording material of the invention, the interface polymerization method is preferably used, in which an oily phase prepared by dissolving or dispersing the coloring component in a hydrophobic organic solvent to be a core of capsules is mixed with an aqueous phase having a water soluble polymer dissolved therein, and after emulsification dispersion by a means such as a homogenizer, the mixture is heated to cause a polymer forming reaction on an interface of oil droplets, so as to form a microcapsule wall of a polymer substance.

According thereto, capsules having a uniform diameter can be formed in a short period of time, and a recording material excellent in storage stability can be obtained.

A reactant forming the polymer substance is added to the interior of the oil droplets and/or the exterior of the oil droplets. Specific examples of the polymer substance include polyurethanes, polyureas, polyamides, polyesters, polycarbonates, urea-formaldehyde resins, melamine resins, polystyrenes, styrene-methacrylate copolymers and styrene-acrylate copolymers. Among these, polyurethanes, polyureas, polyamides, polyesters and polycarbonates are preferred, and polyurethanes and polyureas are particularly preferred. The polymer substances may be used in combinations of two or mor.

Examples of the water-soluble polymer include gelatins, polyvinyl pyrrolidones and polyvinyl alcohols.

In the case, for example, where polyurethane is used as the capsule wall material, a polyvalent isocyanate and a second substance, which forms a capsule wall by reacting therewith (for example, a polyol and apolyamine) are mixed in the water soluble polymer aqueous solution (aqueous phase) or an oily medium to be encapsulated (oily phase), and after subjecting them to emulsification dispersion, they are heated to cause a polymer forming reaction at the interface of the oil droplets, whereby a microcapsule wall can be formed.

The polyvalent isocyanate and the polyol or polyamine that is reacted therewith that are disclosed in U.S. Pat. No. 3,281,383, No. 3,773,695, No. 3,793,268, JP-B No. 48-40347, No. 49-24159, JP-A No. 48-80191 and No. 48-84086 can be used.

In the invention, when preparing the microcapsules encapsulating the coloring component, the coloring component to be encapsulated (for example, the electron-donating colorless dye or the diazonium salt compound) is present in the microcapsules in either a solution or a solid state.

In the case where the coloring component is encapsulated in the capsules in a solution state, the electron-donating colorless dye or the diazonium salt compound are encapsulated, for example, in such a state that they are dissolved in an organic solvent, and in this case, the amount of the organic solvent used is preferably from 1 to 500 parts by weight per 100 parts by weight of the coloring component.

In general, the organic solvent can be appropriately selected from high boiling point organic solvents, and examples thereof include phosphates, phthalates, acrylates, methacrylates, esters of other carboxylic acids, fatty acid amides, alkylated biphenyls, alkylated terphenyls, chlorinatedparaffins, alkylatednaphthalenes, diallylethanes, compound s, which are solid at ordinary temperature, oligomer oils and polymer oils. Specific examples thereof include those organic solvents that are disclosed in JP-A Nos. 59-178451 to 59-178455, No. 59-178457, No. 60-242094, No. 63-85633, No. 6-194825, No. 7-13310, No. 7-13311, No. 9-106039 and Japanese Patent Application No. 62-75409.

Upon encapsulation, oilless capsules can be formed without using the organic solvent.

In the case where the solubility of the electron-donating colorless dye or the diazonium salt compound to be encapsulated is poor, a low boiling point solvent exhibiting high solubility may be subsidiarily used in conjunction therewith. Examples of the low boiling point solvent include ethyl acetates, propyl acetates, isopropyl acetates, butyl acetate and methylene chlorides.

In the aqueous phase, however, an aqueous solution having a water soluble polymer dissolved therein is used as a protective colloid, and after adding the oily phase thereto, emulsification dispersion is carried out by a means such as a homogenizer. The water soluble polymer is used as a dispersion medium, which makes dispersion uniform and easy and stabilizes the emulsified and dispersed aqueous solution. In order to make the emulsification dispersion more uniform and stabile, a surfactant may be added to at least one of the oily phase and the aqueous phase. Known surfactants for emulsification can be used as the surfactant.

In the case where the surfactant is added, the amount of the surfactant added is preferably from 0.1 to 5% by weight, and particularly preferably from 0.5 to 2% by weight, based on the weight of the oily phase.

The surfactant contained in the aqueous phase can be preferably used by selecting on anionic or nonionic surfactants that does not cause precipitation or aggregation through action with the protective colloid.

Preferred examples of the surfactant include sodium alkylbenzenesulfonates, sodium alkylsulfates, octyl sodium sulfosuccinates and polyalkylene glycols (such as polyoxyethylene nonyl phenyl ethers).

As described above, the water soluble polymer contained as a protective colloid in the aqueous phase to be mixed with the oily phase can be appropriately selected from anionic polymers, nonionic polymers and amphoteric polymers that are known in the art.

The anionic polymer may be natural or synthetic, and examples thereof include those having a —COO— group and an —$SO_2$— group.

Specific examples thereof include natural matters, such as gum arabic, alginic acids and pectins; semisynthetic matters, such as caboxymethylcelloloses, gelatin derivatives, e.g., phthalated gelatins, sulfated starchs, sulfated celluloses and lignin sulfonates and synthetic matters, such as a maleic anhydride group (including hydrolyzed products) copolymers, an acrylic acid group (methacrylic acid group) polymers and copolymer, benzenesulfonic acid group polymers and copolymers, and carboxyl-modified polyvinyl alcohols.

Examples of the nonionic polymer include polyvinyl alcohols, hydroxyethylcelluloses and methylcelluloses.

Examples of the amphoteric polymer include gelatins. Among these, gelatins, gelatin derivatives and polyvinyl alcohols are preferred.

The water soluble polymer is used as an aqueous solution of from 0.01 to 10% by weight.

All of the components, including the coloring components to be used for encapsulation, can be used by being solid dispersed with a means such as a sand mill along with the water soluble polymer and other coloration assistants, but are more preferably used as an emulsion dispersion, which is produced by dissolving the oily components, such as the coloring components, in a high boiling point organic solvent hardly soluble or insoluble in water to form an oily phase, and mixing a polymer aqueous solution (aqueous phase) containing the surfactant and/or the water soluble polymer with the oily phase as a protective colloid, followed by emulsificating with a homogenizer. In this case, a low boiling point solvent may be used as a dissolution assistant.

Furthermore, all of the components, including the coloring components, can be separately emulsion dispersed, and can be preliminary mixed and then dissolved in a high boiling point solvent, followed by subjecting to emulsion dispersing. The emulsion dispersed particles preferably have a diameter of 1 $\mu$m or less.

The emulsion dispersion can be easily carried out, for example, by a means that is generally used for fine particle emulsification, such as high-speed agitation and ultrasonic wave dispersion, and by known emulsifying apparatuses, such as a homogenizers, Manton Goreys, an ultrasonic dispersing apparatuses, dissolvers and KD mills.

After the emulsion dispersion, the emulsified product is heated to 30 to 70° C. to accelerate the capsule wall forming reaction. In order to prevent aggregation of capsules during the reaction, it is necessary that water is added to decrease the collision probability of the capsules, and sufficient agitation is effected.

A dispersant for preventing aggregation may be newly added during the reaction. Formation of carbon dioxide gas is observed in association with progress of the polymerization reaction, and the end point of the capsule wall formation reaction can be detected by termination of the formation thereof. In general, microcapsules encapsulating the objective dye can be obtained by continuing the reaction for several hours.

The average particle diameter of the microcapsules used in the recording medium of the invention is preferably 20 $\mu$m or less, and more preferably, from the standpoint for obtaining high resolution, 5 $\mu$m or less. When the diameter of the microcapsules thus formed is too small, the surface area per unit solid content becomes large and requires a large amount of the wall material, and therefore, the average particle diameter is preferably 0.1 $\mu$m or more.

Other Recording Layers

Other recording layers can be formed, for example, by applying an applied coat liquid, which is prepared to have photosensitivity in a prescribed wavelength region.

Other Materials

The recording layer may contain, in addition to the foregoing components, various kinds of surfactants for various purposes, such as applying assistance, static charge prevention, sliding improvement, emulsion dispersion and adhesion prevention.

Examples of the surfactant include nonionic surfactants, such as saponins, polyethylene oxides, polyethylene oxide derivatives, such as alkyl ether of polyethylene oxides, anionic surfactants, such as alkylsulfonates, alkylbenzenesulfonates, alkylnaphthalenesulfonates, alkylsulfates, N-acyl-N-alkyltaurines, sulfosuccinates and sulfoalkylpolyoxyethylene alkylphenyl ethers, amphoteric surfactants, such as alkylbetaines and alkylsulfobetains, and cationic surfactants, such as aliphatic or aromatic quaternary ammonium salts.

As other additives depending on necessity, for example, dye, ultraviolet ray absorbents, plasticizers, fluorescent whitening agents, matting agents, coating assistants, hardening agents, antistatic agents and sliding improvers may also be added.

Representative examples of the additives are disclosed in "Research Disclosure", vol. 176, item 17643, December 1978, and "Research Disclosure", vol. 187, item 18716, November 1979.

In the recording layer, and in the intermediate layer, the protective layer and the like described later, a hardening agent may be used in combination depending on necessity. In particular, it is preferred to use a hardening agent in the protective layer to reduce adhesiveness of the protective layer.

As the hardening agent, for example, gelatin hardening agents used for production of photographic photosensitive materials are useful, and examples thereof include aldehyde compounds, such as formaldehyde and glutaric aldehyde, reactive halogen compounds disclosed in U.S. Pat. No. 3,635,718, compounds having a reactive ethylenic unsaturated bond disclosed in U.S. Pat. No. 3,635,718, aziridine compounds disclosed in U.S. Pat. No. 3,017,280, epoxy compounds disclosed in U.S. Pat. No. 3,091,537, halogenocarboxyaldehydes, such as mucochloric acids, dioxanes, such as dihydroxydioxanes and dichlorodioxanes, vinylsulfones disclosed in U.S. Pat. No. 3,642,486 and U.S. Pat. No. 3,687,707, vinylsulfone precursors disclosed in U.S. Pat. No. 3,841,872, and ketovinyls disclosed in U.S. Pat. No. 3,640,720. Furthermore, chromium alum, zirconium sulfate and boric acid are examples of an inorganic hardening agent.

Among these, preferable compounds are 1,3,5-triacryloyl-hexahydro-s-triazines, 1,2-bisvinylsulfonylmethanes, 1,3-bis(vinylsulfonylmethyl) propanol-2s, bis($\alpha$-vinylsulfonylacetamide)ethanes, 2,4-dichloro-6-hydroxy-s-triazine sodium salts, 2,4,6-triethylenimino-s-triazines and boric acids.

The hardening agent is preferably added in an amount of from 0.5 to 5% by weight based on the amount of the binder used, which will be described later.

Intermediate Layer

An intermediate layer may be provided between the respective monochrome recording layers. The intermediate layer formed mainly with a binder, and depending on necessity, may contain additives, such as hardening agents, polymer latexes, filter dyes, micas and an ultraviolet ray absorbents.

The binder is preferably a polymer having a molecular weight of about from 5,000 to 2,000,000, and more preferably about from 10,000 to 1,000,000. Examples thereof include a homopolymers or copolymers of acrylate and methacrylate (such as, copolymers of methylmethacrylate, ethylacrylate and methacrylic acid, poly(alkyl methacrylate) and poly(alkyl acrylate)), cellulose esters or cellulose ethers (such as cellulose acetates, cellulose acetate butylates, methylcelluloses and ethylcelluloses), polyvinyl butyrals, polyvinyl formals, cyclized rubbers, polyethers (such as polyethylene oxides, polypropylene oxides and polytetrahydrofurans), polystyrenes, polycarbonates, polyurethanes, chlorinated polyolefins, polyvinyl chlorides, vinyl chloride-vinylidene chloride copolymers, copolymers of vinylidene chloride and acrylonitrile, methyl methacrylates, vinyl acetates, polyvinyl acetates, copoly (ethylene-vinyl acetates), polycaprolactams, poly (hexamethylene adipamides), polyesters (such as poly (ethylene glycol terephthalates) and poly(hexamethylene glycol succinates), polyamides and polyureas.

Examples thereof also include gelatin compounds, (modified)polyvinyl alcohols, polyvinyl pyrrolidones, a hydrolyzed products of a styrene-maleic acid copolymer, sodium polystyrenesulfonates and sodium alginates. Furthermore, latexes, such as styrene-butadiene rubber latexes, an acrylonitrile-butadiene rubber latexes and methyl methacrylate-butadiene rubber latexes may also be used.

An unsaturated compound may also be used as a mixture with components for forming a non-photopolymerizable film, and examples thereof include physically dried polymers and a polymer solutions in an organic solvent, for example, nitrocellulose or cellulose acetate butylates. However, they may be a chemically and/or thermally curable (i.e., thermosetting) resins, such as polyisocyanates, polyepoxides, a melamine resins and polyimide precursors. The use of the thermosetting resin is important upon using in such a system that is known as a hybrid system, which is crosslinked by photopolymerization in the first step and then by a post heat treatment in the second step.

As the binder, solvent soluble polymers, such as polystyrenes, polyvinyl formals, polyvinyl butyrals, an acrylic resin, e.g., polymethyl methacrylates, polybutyl acrylates, polymethyl methacrylates, polybutyl methacrylates and copolymers thereof, phenol resins, styrene-butadiene resins, ethylcelluloses, epoxy resins and urethane resins, and latexes of the polymers may be used in addition to the water soluble polymer used in the aqueous phase upon encapsulation of the coloring components. Among these, gelatins and polyvinyls alcohol are preferred.

These binder may be used in the protective layer described later and the recording layer.

In order to prevent interlayer diffusion of the active ingredients in the recording layer, it is preferred to contain mica or synthetic mica (such as Suzulite 40H, produced by MRI Corp.). The addition of the filter dye is preferred since a high definition image can be obtained. The filter dye can be selected from the organic dyes having been described herein, and it is preferred that the dye is appropriately selected from such compounds that have light absorption wavelengths of the upper layers of the respective intermediate layers.

The thickness of the intermediate layer is preferably from 0.1 to 10 μm, and more preferably from 0.5 to 3 μm.

Protective Layer and Layer containing Titanium Oxide

The protective layer of the recording material of the invention is provided as the outermost layer on the side of the recording layer of the recording material, which is the incident side of irradiated light, as described above. The protective layer or a layer adjacent to the protective layer is formed as a layer containing titanium oxide. By providing the layer containing titanium oxide, titanium oxide absorbs ultraviolet rays, whereby the light fastness is improved, and glossiness can be improved.

As described above, the protective layer may contain either a single layer or multiple layers. In the case where the protective layer contains multiple layers, and the layer containing titanium oxide is formed in the protective layer, the layer containing titanium oxide is formed as the outermost layer of the protective layer or a layer adjacent to the outermost layer.

The titanium oxide contained in the layer containing titanium oxide preferably has a particle diameter of 0.2 μm or less. When the particle diameter of titanium oxide is 0.2 μm or less, the transparency of the layer containing titanium oxide can be further increased. The particle diameter of titanium oxide is more preferably 0.1 μm or less.

It is known that titanium oxide has three kinds of crystalline structures, i.e., rutile, brookite and anatase, and the rutile type is most preferably used in the layer containing titanium oxide of the recording layer of the invention.

The content ratio of titanium oxide contained in the layer containing titanium oxide is preferably from 5 to 90% by weight based on the layer containing titanium oxide. When the content ratio of titanium oxide is in this range, more preferrable results can be obtained in glossiness, light fastness and transparency of the recording material. It is more preferably from 20 to 80% by weight.

Examples of a material (binder) used in the protective layer and the layer containing titanium oxide include water soluble polymers, such as gelatins, polyvinyl alcohols, carboxyl-modified polyvinyl alcohols, a vinyl acetate-acrylamide copolymers, silicon-modified polyvinyl alcohols, starchs, modified starches, methylcelluloses, carboxymethylcelluloses, hydroxymethylcelluloses, gelatins, gum arabic, caseins, a hydrolyzed products of a styrene-maleic acid copolymer, half ester hydrolyzed products of a styrene-maleic acid copolymer, hydrolyzed products of an isobutylene-maleic anhydride copolymer, polyacrylamide derivatives, polyvinylpyrrolidones, sodium polystyrenesulfonates and sodium alginates, and latexes, such as styrene-butadiene rubber latexes, acrylonitrile-butadiene rubber latexes, methyl methacrylate-butadiene rubber latexes and vinyl acetate emulsions.

The layer containing titanium oxide can be formed, for example, by dispersing titanium oxide on the surface of the binder, which is formed as a layer. As the binder, polyvinyl alcohol (PVA) is preferably used. By forming the layer containing titanium oxide by using polyvinyl alcohol, particularly high light fastness can be imparted.

It is possible that the materials used in the protective layer are crosslinked, whereby the storage stability can be further improved. In this case, known crosslinking agents can be used as a crosslinking agent used for the crosslinking, and specific examples thereof include N-methylolureas, N-methylolmelamines, water soluble initial condensates of urea-formalin and the like, glyoxals, dialdehyde compounds, such as glutaric aldehydes, inorganic crosslinking agents, such as boric acids and boraxes, and polyamide epichlorohydrins.

In the protective layer, pigments, metallic soaps, waxes, surfactants and the like, which are known in the art, can be added, and UV absorbents and UV absorbent precursors, which are known in the art can also be added.

The coated amount of the protective layer is preferably from 0.2 to 5 $g/m^2$, and more preferably from 0.5 to 3 $g/m^2$.

Support

Examples of the support include papers, coated papers, synthetic papers, such as laminated papers, films, such as polyethylene terephthalate films, cellulose triacetate films, polyethylene films, polystyrene films and polycarbonate films, metallic plates, such as aluminum, zinc and copper, and those obtained by subjecting the surface of the supports to various kinds of treatments, such as surface treatments, base coating treatments and metallized treatments.

Furthermore, supports disclosed in "Research Disclosure", vol. 200, Item 20036, Section XVII, December 1980, can also be exemplified. The supports may contain fluorescent whitening agents, blueing agents, pigments, and the like. A sheet of polyurethane foam or rubber which has elasticity, may be used as the support by itself.

Furthermore, depending on necessity, an antihalation layer may be provided on the front surface of the support used, and a sliding layer, an antistatic layer, a curl preventing layer, an adhesive layer and the like may be provided on the back surface thereof. An adhesive layer may be formed between the support and the recording layer to provide a constitution of seal form, in that the support is used as released paper.

In the case where the antihalation layer is provided between the support and the recording layer or on the surface of the support, on which the recording layer is not provided, an antihalation layer that can be bleached by irradiation of light or heat may be provided for a transparent support.

In the case where the antihalation layer is the layer that can be bleached by irradiation of light, for example, a combination of an organic dye and an organic boron compound can be utilized, and in the case where it is the layer that can be bleached by heat, for example, such a constitution can be utilized in that a base or a nucleophilic reagent is formed by heat to bleach a coexisting organic dye.

A layer containing a polymer having low oxygen permeability, such as gelatins and polyvinyl alcohols (PVA), may be provided between the support and the recording layer. Color deterioration caused by photooxydation of the formed image can be effectively prevented by providing this layer.

Production of Recording Material

The recording material of the invention can be produced in such a manner that coating compositions for the recording layer, the protective layer and the intermediate layer are prepared by such a means that the components are dissolved in a solvent depending on necessity, and they are coated on the support by a known coating method, followed by drying. Examples of the solvent include water; alcohols, such as methanols, ethanols, n-propanols, isopropanols, n-butanols, sec-butanols, methyl cellosolves and 1-methoxy-2- propanols; halogenated solvents, such as methylene chlorides and ethylene chlorides; ketones, such as acetones, cyclohexanones and methyl ethyl ketones; esters, such as methyl cellosolve acetates, ethyl acetates and methyl acetates; toluenes; xylenes; and mixtures of two or more of the above.

Examples of the known coating method include methods using, for example, blade coaters, rod coaters, knife coaters, doctor roll coaters, reverse roll coaters, transfer roll coaters, gravure coaters, kiss roll coaters, curtain coaters and extrusion coaters.

The coating operation can also be carried out with reference to "Research Disclosure", vol. 200, Item 20036, Section XV, December 1980.

The multi-color recording material can be constituted, for example, in the following manner.

A first recording layer containing microcapsules, which contain a coloring component that produces yellow and a photopolymerizable composition sensitive to a center wavelength $\lambda_1$ of a light source is provided on a support, a second recording layer containing microcapsules, which contain a coloring component that produces magenta and a photopolymerizable composition sensitive to a center wavelength $\lambda_2$ is provided on the first recording layer, and a third recording layer containing microcapsules, which contain a coloring component that poduces cyan and a photopolymerizable composition sensitive to a center wavelength $\lambda_3$ is provided on the second recording layer. In the invention, at least one layer of the first to third recording layers is constituted to have the first embodiment or the second embodiment described above. A layer containing titanium oxide is then provided as a protective layer on the outer surface of the third recording layer. In the case where the protective layer contains multiple layers, the outermost layer of the protective layer or a layer adjacent to the outermost layer is the layer containing titanium oxide. An intermediate layer may be provided between the respective recording layer depending on necessity. The center wavelengths $\lambda_1$, $\lambda_2$ and $\lambda_3$ of the light sources are different from each other.

In the case where a multi-color image is to be formed using the recording material of the multi-color type, image exposure is carried out in the exposing step described later by using multiple light sources having different wavelengths, which are adapted to the absorption wavelengths of the respective recording layers, and thus the recording layers having the absorption wavelengths of the light sources selectively form respective latent images, thus forming a multi-color image of high sharpness with high sensitivity. Thereafter, the surface of the recording layer is further irradiated with light to decolor the colored components (absorption components corresponding to light of those wavelengths) remaining in the layers, such as the organic dye, and therefore, a high quality image having a low fog density and high contrast can be formed.

According to the foregoing manner, the recording material of the invention can be used in such purposes as a color printer, a label, color proof, a duplicator, fax and intermediate paper.

Image Forming Method

The respective steps of the process for forming an image of the invention using the foregoing recording material will be described. The process for forming an image comprises an exposing step, a coloring step and a fixing step, as described above.

In the exposing step, the photopolymerizable composition and the substantially colorless compound, which has a site producing a color through a reaction with the coloring component in the recording layer, is exposed in a pattern of an image form, whereby it is cured in the pattern.

In the exposing step, the light source used for image formation is preferably selected from light sources having wavelengths adapted to the respective absorption wavelengths from the standpoint of obtaining high sensitivity and high sharpness. Specifically, known light sources having wavelengths from ultraviolet to infrared regions can be used by selecting from light sources having maximum absorption wavelengths in a range of from 300 to 1,000 nm. For example, laser light sources of blue, green, violet and red and an LED are preferred since the apparatus can be simplified and miniaturized, and the cost can be reduced.

After carrying out the exposing step, the coloring step is performed. In the coloring step, the surface of the recording layer is heated to react the coloring component contained in the recording layer and the substantially colorless compound producing a color by reacting with the coloring component and having a site that produces a color when reacted with the coloring component, whereby coloration occurs in the form of the latent image being formed and producing a visual image.

The heating operation is carried out with a heat roller, and in general, the heating temperature is preferably from 80 to 200° C., and more preferably from 85 to 130° C. When the heating temperature is less than 80° C., the coloring density may become insufficient, and when it exceeds 200° C., the non-image part (background part) may form a color, and the support may be damaged. The heating time is preferably from 1 second to 5 minutes, and more preferably from 3 seconds to 1 minute.

Upon carrying out the heating operation, further high sensitivity can be obtained by performing a preheating step, in which the entire surface of the recording material is uniformly preheated to a prescribed temperature lower than the coloring temperature.

After carrying out the coloring step, the fixing step is performed. In the fixing step, the entire surface of the recording material is irradiated with light by a particular light source, whereby the image formed in the coloring step is fixed, and the coloration due to the colored component (organic dye) remaining in the recording layer is decolored.

Through the fixing step, whiteness of the non-image part can be improved to obtain a chemically stable final image. In the case where a diazonium salt compound is used as the coloring component, the diazonium salt compound remaining in the recording material after the image formation can be deactivated by irradiation with light, and thus it is useful for stabilization upon storing the formed image without fluctuations in density and discoloration.

Preferred examples of the light source that can be used in the fixing step include wide varieties of light sources, such as mercury lamps, ultra-high pressure mercury lamps, electrodeless discharge type mercury lamps, xenon lamps, tungsten lamps, metal halide lamps and fluorescent lamps.

The method for irradiation with light in the fixing step is not particularly limited. While both the following methods may be used, i.e., a method of irradiating the entire surface of the recording layer at the same time, and a method of gradually irradiating the recording surface, for example, by scanning, whereby the entire surface is finally irradiated, a method can be employed such that the entire recording surface of the recording material after the image formation can be irradiated with substantially uniform irradiation light. Accordingly, it is preferred that the entire recording surface is irradiated with light from the standpoint that the effects of the invention are effectively achieved.

The time for irradiating with light in the fixing step may be such a period that the formed image is fixed, and the non-image part (background part) is sufficiently decolored, and in order to obtaining sufficient image fixing property and decoloration property with no deterioration in recording rate, it is preferably from several seconds to several tens minutes, and more preferably from several seconds to several minutes.

According to the process for forming an image of the invention, when the heating operation in the coloring step is carried out with a heat roller, an image can be successfully formed without any influence on the layer containing titanium oxide of the recording layer. A thermal head, on the other hand, is not preferrable since titanium oxide fine particles are attached to the thermal head.

EXAMPLES

The invention will be described with reference to the following examples, but the invention is not construed as being limited to the examples. "Parts" and "percents" in the examples denote "parts by weight" and "% by weight", respectively.

Preparation of Microcapsule Liquid encapsulating Electron-donating Colorless Dye 4.4 parts of the following electron-donating colorless dye (1) coloring yellow was dissolved in 18.4 parts by weight of ethyl acetate, and 21 parts of a capsule wall material (Takenate D-110N, a trade name, produced by Takeda Chemical Industries, Ltd.) and 0.7 part of another capsule wall material (Millionate MR200, a trade name, produced by Nippon Polyurethane Co., Ltd.) were added thereto.

The resulting solution was added to a mixed solution of 52 parts of 8%-phthalated gelatin and 0.3 part of a 10% sodium dodecylbenzenesulfonate solution, and then emulsion dispersed at a temperature of 20° C. to obtain a emulsion liquid. 54 parts of a 1.1% tetraethylenepentamine solution was added to the resulting emulsion liquid, and the mixture was heated to 60° C. while being stirred. After two hours, a microcapsule liquid having an average particle diameter of 0.5 μm containing the electron-donating colorless dye (1) as a core. The solid content thereof was then adjusted to 25% by adding water.

Electron-donating Colorless Dye (1)

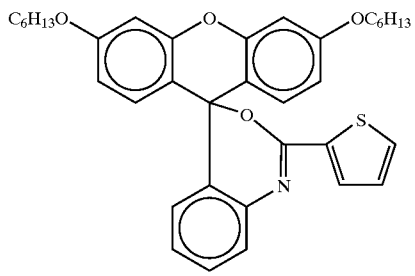

Preparation of Photopolymerizable Composition Emulsion Liquid 100.0 parts of a mixture of the following electron-accepting compounds having a polymerizable group (1) and (2) (mixing ratio: 50/50) and 0.1 part of the following heat polymerization inhibitor (AL1) were dissolved in 125.0 parts of isopropyl acetate (solubility in water: ca. 4.3%) to obtain a mixed solution I. 6.0 parts of the following organic boron compound was added to the mixed solution I, followed by dissolution at 42° C., to obtain a mixed solution II.

The mixed solution II was added to a mixed solution of 300.1 parts of a 8% gelatin solution and 17.4 parts of the following 10% surfactant (1) aqueous solution, and emulsification was carried out at a rotation speed of 10,000 for 5 minutes by using a homogenizer (produced by Nippon Seiki Co., Ltd.) to obtain a photopolymerizable composition emulsion liquid (1). Thereafter, solvent removal was carried out at 40° C. for 3 hours, and then the solid content was adjusted to 30%.

Electron-accepting Compounds Having a Polymerizable Group (1) and (2)

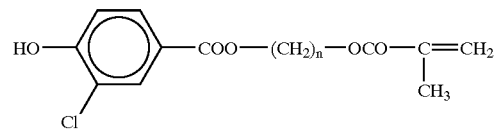

n = 5 (1)
n = 6 (2)

AL1

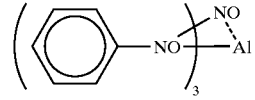

Surfactant (1)

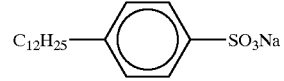

Organic boron compound

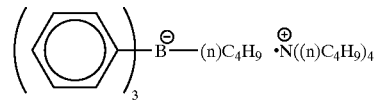

Preparation of a Light and Heat Sensitive Recording Layer and a Coating Solution Therefor 8.4 parts by weight of the aforementioned emulsion of a photopolymerizable composition, 3.3 parts by weight of the aforementioned thermally responsive microcapsule solution including an electron-donating colorless dye and 0.9 parts by weight of a 15% gelatin solution were mixed to prepare a coating solution for a light and heat sensitive recording layer.

8 mass by weight of water-swellable synthetic mica (trade name: Somashif ME100, manufactured by Cope Chemical) was mixed with 98 part by mass water and the mixture was wet-dispersed using a viscomill to prepare a mica dispersion having an averge particle diameter of 2.0 μm. 950 parts by weight of water was added to 100 parts by weight the dispersion and the both were uniformly mixed. Thereafter, 500 parts by weight of an aqueous 15% alkali-treated gelatin solution was added to the mixture while the mixture was kept at 40° C. and stirred. Further, 50 parts by weight of 2% sodium (4-nonylphenoxyrioxyethylene)butyl sulfonate was added to the resulting mixture to obtain an undercoating solution containing mica. The resulting undercoating solution was applied to the support (resin-coated paper) such that the dry weight was 2.0 g/m² and dried to form an undercoat layer.

The aforementioned coating solution for a light and heat sensitive recording layer was applied to the undercoat layer such that the dry weight was 4.5 g/m² and dried to obtain a recording material.

Example 1

16 g of a titanium oxide ultra-fine particle dispersion liquid (ELCOM-P, a trade name, produced by Shokubai Kagaku Co., Ltd., solid content: 20% by weight), 1.5 g of a 2% surfactant A and 4.5 g of a 2% surfactant B were added to 80 g of a 4% gelatin aqueous solution to produce a protective layer coating composition 1. The protective layer coating composition 1 was coated and dried on the sensitive material to make a solid content after drying of 2 g/m$^2$ to obtain Sample 1. The content ratio of titanium oxide with respect to gelatin was 100%, and the particle diameter of titanium oxide was 10 nm.

Example 2

4 g of a titanium oxide ultra-fine particle dispersion liquid (ELCOM-P, a trade name, produced by Shokubai Kagaku Co., Ltd., solid content: 20% by weight), 1.5 g of a 2% surfactant A and 4.5 g of a 2% surfactant B were added to 80 g of a 4% PVA aqueous solution (PVA124C, a trade name, produced by Kuraray Co., Ltd.) to produce a protective layer coating composition 2. The protective layer coating composition 2 was coated and dried on the sensitive material to make a solid content after drying of 2 g/m$^2$ to obtain Sample 2. The content ratio of titanium oxide with respect to PVA was 25%, and the particle diameter of titanium oxide was 10 nm.

Example 3

16 g of a titanium oxide ultra-fine particle dispersion liquid (ELCOM-P, a trade name, produced by Shokubai Kagaku Co., Ltd., solid content: 20% by weight), 4.5 g of a 2% surfactant A and 4.5 g of a 2% surfactant B were added to 80 g of a 4% PVA aqueous solution (PVA124C, a trade name, produced by Kuraray Co., Ltd.) to produce a protective layer coating composition 3. The protective layer coating composition 3 was coated and dried on the sensitive material to make a solid content after drying of 2 g/m$^2$ to obtain Sample 3. The content ratio of titanium oxide with respect to PVA was 100%, and the particle diameter of titanium oxide was 10 nm.

Example 4

16 g of a titanium oxide ultra-fine particle dispersion liquid (ELCOM-P, a trade name, produced by Shokubai Kagaku Co., Ltd., solid content: 20% by weight), 1.5 g of a 2% surfactant A and 4.5 g of a 2% surfactant B were added to 80 g of a 4% PVA aqueous solution (R2105, a trade name, produced by Kuraray Co., Ltd.) to produce a protective layer coating composition 4. The protective layer coating composition 4 was coated and dried on the sensitive material to make a solid content after drying of 2 g/m$^2$ to obtain Sample 4. The content ratio of titanium oxide with respect to PVA was 100%, and the particle diameter of titanium oxide was 10 nm.

Example 5

A protective layer coating composition produced in the following Comparative Example 1 was further coated and dried to make a solid content of 2 g/m$^2$ on Sample 4 produced in Example 4 to obtain Sample 5. The content ratio of titanium oxide with respect to PVA was 100%, and the particle diameter of titanium oxide was 10 nm.

Comparative Example 1

1.5 g of a 2% surfactant A and 4.5 g of a 2% surfactant B were added to 94 g of 6% gelatin to produce a protective layer coating composition 5. The protective layer coating composition 5 was coated and dried on the sensitive material to make a solid content after drying of 2 g/m$^2$ to obtain Sample 6.

Image Forming Method

Samples 1 to 6 obtained in the foregoing were subjected to image formation in the following manner. Herein, the case of Sample 1 will be shown as an example.

Sample 1 was imagewise exposed from the side of the protective layer to a step wedge form to make irradiation energy being stepwise changed with a maximum irradiation energy of 12 mJ/cm$^2$ by using semiconductor laser light having a wavelength of 405 nm (exposing step). Subsequently, Sample 1 thus exposed to have a latent image formed therein was heated for 10 seconds on a hot plate at 110° C. (coloring step), and then the entire surface of the recording layer was irradiated for 30 seconds by using a fluorescent lamp irradiating apparatus of 38,000 lux (fixing step).

Evaluation of Glossiness

The glossiness of the recorded sample was measured at an incident angle of 20° with a digital angular displacement glossmeter (UGV-5D, trade name, produced by Suga Test Instruments Co., Ltd.).

Evaluation of Light Fastness

The light fastness of the recorded sample was measured in such manner that the sample was exposed to light at 85,000 lux for 72 hours with a xenon weather-ometer (Ci5000, a trade name, produced by Atlas Weathering Services), and the increment of Y- OD on the background part (ΔOD-Y) was measured with a Macbeth densitometer.

The measurement results are shown in Table 1.

TABLE 1

| | Binder | Coated amount | Glossiness (20°) | Light fastness Background coloration (ΔOD-Y) |
|---|---|---|---|---|
| Example 1 | Gelatin | 2 g/m$^2$ | 30% | +0.12 |
| Example 2 | PVA124C | 2 g/m$^2$ | 30% | +0.12 |
| Example 3 | PVA124C | 2 g/m$^2$ | 33% | +0.06 |
| Example 4 | R2105 | 2 g/m$^2$ | 36% | +0.06 |
| Example 5 | R2105 Gelatin | 2 g/m$^2$ 2 g/m$^2$ | 38% | +0.05 |
| Comparative Example 1 | Gelatin | 2 g/m$^2$ | 23% | +0.30 |

It was understood from the results in Table 1 that images having high glossiness could be obtained in the recording materials of the examples (Samples 1 to 5) having a layer containing titanium oxide in comparison to Sample 6 of the comparative example. Such recording materials that are excellent in light fastness on both the colored part and the background part could be obtained.

According to the invention, a recording material having high glossiness and high light fastness and a process for forming an image using the recording material can be provided.

What is claimed is:

1. A recording material comprising:
   a support;
   a recording layer provided on the support; and
   at least one protective layer provided on the recording layer,
   wherein the recording layer contains a coloring component A encapsulated in heat-responsive microcapsules, and a substantially colorless compound B, which is outside the heat-responsive microcapsules and has a coloring site that colors when reacted with the coloring component A,
   wherein at least one of the protective layer or a layer adjacent thereto comprises a layer containing titanium oxide, wherein the titanium oxide has a particle diameter of 0.2 μm or less, and wherein the at least one protective layer comprises at least a first protective layer and a second protective layer, and the outermost protective layer or a layer adjacent to the outermost layer is the layer containing titanium oxide.

2. The recording layer according to claim 1, wherein the recording layer further contains a photopolymerizable composition.

3. The recording layer according to claim 2, wherein the compound B includes the coloring site and a polymerizable group in one molecule.

4. The recording layer according to claim 2, wherein the recording layer further contains a substantially colorless compound C, which has a site that suppresses a reaction between the coloring component A and the compound B and a polymerizable group in one molecule.

5. The recording layer according to claim 2, wherein titanium oxide contained in the layer containing titanium oxide has a particle diameter of no more than 0.2 μm.

6. The recording layer according to claim 2, wherein the layer containing titanium oxide contains from 5 to 90% by weight titanium oxide.

7. The recording layer according to claim 1, wherein the compound B includes the coloring site and a polymerizable group in one molecule.

8. The recording layer according to claim 1, wherein the recording layer further contains a substantially colorless compound C, which has a site that suppresses a reaction between the coloring component A and the compound B and a polymerizable group in one molecule.

9. The recording layer according to claim 1, wherein titanium oxide contained in the layer containing titanium oxide has a particle diameter of no more than 0.2 μm.

10. The recording layer according to claim 1, wherein the layer containing titanium oxide contains from 5 to 90% by weight titanium oxide.

11. The recording layer according to claim 1, wherein the layer containing titanium oxide comprises a binder formed in a layer having titanium oxide dispersed on a surface thereof, which binder comprises polyvinyl alcohol.

12. The recording layer according to claim 1, wherein the titanium oxide has a particle diameter of 0.1 μm or less.

* * * * *